(12) United States Patent
Hwang et al.

(10) Patent No.: US 12,087,754 B2
(45) Date of Patent: Sep. 10, 2024

(54) HYBRID ELEMENT AND METHOD OF FABRICATING THE SAME

(71) Applicant: SAMSUNG ELECTRONICS CO., LTD., Suwon-si (KR)

(72) Inventors: Kyungwook Hwang, Seoul (KR); Junsik Hwang, Hwaseong-si (KR); Dongho Kim, Seoul (KR); Hyunjoon Kim, Seoul (KR); Joonyong Park, Suwon-si (KR); Seogwoo Hong, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 245 days.

(21) Appl. No.: 17/667,241

(22) Filed: Feb. 8, 2022

(65) Prior Publication Data

US 2022/0262784 A1 Aug. 18, 2022

Related U.S. Application Data

(60) Provisional application No. 63/149,824, filed on Feb. 16, 2021.

(30) Foreign Application Priority Data

Jun. 3, 2021 (KR) .................. 10-2021-0072400
Nov. 4, 2021 (KR) .................. 10-2021-0150860

(51) Int. Cl.
- *H01L 25/00* (2006.01)
- *H01L 25/16* (2023.01)
- *H01L 27/15* (2006.01)

(52) U.S. Cl.
CPC ............ *H01L 25/50* (2013.01); *H01L 25/167* (2013.01); *H01L 27/15* (2013.01)

(58) Field of Classification Search
CPC ....... H01L 25/50; H01L 25/167; H01L 27/15; H01L 24/08; H01L 24/06; H01L 24/09
See application file for complete search history.

(56) References Cited

U.S. PATENT DOCUMENTS 6,621,962 B2  9/2003  Kitaoka et al.
7,629,026 B2  12/2009 Sharma et al.
(Continued)

FOREIGN PATENT DOCUMENTS

JP   2001-337253 A   12/2001
JP   4899675 B2      3/2012
(Continued)

OTHER PUBLICATIONS

Communication issued on Jul. 1, 2024 by the Korean Intellectual Property Office for Korean Patent Application No. 10-2021-0150860.

*Primary Examiner* — Thao P Le
(74) *Attorney, Agent, or Firm* — Sughrue Mion, PLLC

(57) ABSTRACT

Provided is a method of fabricating a hybrid element, the method including forming a plurality of first elements on a first substrate, separating a plurality of second elements grown on a second substrate from the second substrate, a material of the second substrate being different from a material of the first substrate, and transferring the plurality of second elements, separated from the second substrate, onto the first substrate, wherein, in the transferring, the plurality of second elements are spaced apart from each other by a fluidic self-assembly method, and wherein each of the plurality of second elements includes a shuttle layer grown on the second substrate, an element layer grown on the shuttle layer, and an electrode layer on the element layer.

14 Claims, 18 Drawing Sheets

(56) References Cited

U.S. PATENT DOCUMENTS

| | | |
|---|---|---|
| 7,687,277 B2 | 3/2010 | Sharma et al. |
| 7,874,474 B2 | 1/2011 | Kim et al. |
| 8,101,457 B2 | 1/2012 | Tomoda et al. |
| 9,136,442 B2 * | 9/2015 | Weng ............... H01L 33/50 |
| 9,224,851 B2 * | 12/2015 | Dykaar ............. H01L 21/02636 |
| 9,722,145 B2 | 8/2017 | Sasaki et al. |
| 10,804,426 B2 | 10/2020 | Schuele et al. |
| 2013/0096033 A1 * | 4/2013 | Routenberg ......... C12Q 1/6837 506/26 |
| 2016/0356715 A1 * | 12/2016 | Zhong ................. H01L 27/00 |
| 2017/0133558 A1 | 5/2017 | Sasaki et al. |
| 2019/0214373 A1 * | 7/2019 | Kim .................. H01L 33/08 |
| 2021/0036187 A1 | 2/2021 | Lee et al. |
| 2021/0091052 A1 | 3/2021 | Schuele et al. |
| 2021/0296296 A1 | 9/2021 | Choi et al. |
| 2021/0351158 A1 | 11/2021 | Choi et al. |
| 2022/0013400 A1 | 1/2022 | Hwang et al. |
| 2022/0223437 A1 | 7/2022 | Lee et al. |

FOREIGN PATENT DOCUMENTS

| | | |
|---|---|---|
| KR | 10-2017-0101064 A | 9/2017 |
| KR | 10-2019-0050201 A | 5/2019 |
| KR | 10-2020-0026669 A | 3/2020 |
| KR | 10-2020-0046819 A | 5/2020 |
| KR | 10-2020-0062762 A | 6/2020 |
| KR | 10-2022-0007500 A | 1/2022 |

* cited by examiner

HYBRID ELEMENT AND METHOD OF FABRICATING THE SAME

CROSS-REFERENCE TO RELATED APPLICATIONS

This application is based on and claims priority under 35 U.S.C. § 119 to U.S. Provisional Patent Application No. 63/149,824, filed on Feb. 16, 2021, in the United States Patent and Trademark Office, Korean Patent Application No. 10-2021-0072400, filed on Jun. 3, 2021, and Korean Patent Application No. 10-2021-0150860 filed on Nov. 4, 2021 in the Korean Intellectual Property Office, the disclosures of which are incorporated by reference herein in their entireties.

BACKGROUND

1. Field

Example embodiments of the present disclosure relate to a hybrid element and a method of fabricating the same.

2. Description of Related Art

An electronic element (or device) including a display, a semiconductor, and the like may have various elements each performing a certain function therein.

These elements may be difficult to be simultaneously grown or formed on one substrate because of differences in their materials or process conditions. For example, it may be difficult to simultaneously grow or form, on one substrate, elements that are producible on a silicon substrate, and elements that are producible on a sapphire substrate.

Accordingly, in order to arrange, on one substrate, elements produced on different substrates, some of the elements may be separated from one of the substrates and transferred onto another substrate on which the other elements are formed. Accordingly, a hybrid element having a plurality of elements of different types may be fabricated.

As a transfer method, a pick-and-place method of individually picking up a second element formed on a substrate and placing the second element on another substrate on which a first element is formed may be considered.

However, in such a pick-and-place method, the productivity may be reduced as the size of the second elements to be transferred decreases, or as the size of the substrate onto which the second elements are transferred increases.

SUMMARY

One or more example embodiments provide a hybrid element in which elements of different types are arranged, and a method of fabricating the same.

Additional aspects will be set forth in part in the description which follows and, in part, will be apparent from the description, or may be learned by practice of example embodiments.

According to an aspect of an example embodiment, there is provided a method of fabricating a hybrid element, the method including forming a plurality of first elements on a first substrate, separating a plurality of second elements grown on a second substrate from the second substrate, a material of the second substrate being different from a material of the first substrate, and transferring the plurality of second elements, separated from the second substrate, onto the first substrate, wherein, in the transferring, the plurality of second elements are spaced apart from each other by a fluidic self-assembly method, and wherein each of the plurality of second elements includes a shuttle layer grown on the second substrate, an element layer grown on the shuttle layer, and an electrode layer on the element layer.

The second substrate may be smaller than the first substrate.

The first element may be an element which is configured to be formed on the first substrate and may include a group IV material.

The first element may include at least one of a complementary metal-oxide semiconductor (CMOS), a memory, an integrated circuit, an optical sensor, and a solar cell.

The second substrate may include a substrate may include a group III-V material or a sapphire substrate, and the second element may include at least one of a light-emitting diode, a laser, a detector, and an electronic element. The electronic element comprises at least one of a high-electron-mobility transistor, a field-effect transistor, a thin-film transistor, or an insulated-gate bipolar transistor, a radio-frequency device, a thin-film battery, an integrated circuit, a transceiver, a memory, a voltage regulator, an amplifier, a switch, and an electro-optical sensor.

In the transferring, by the fluidic self-assembly method, the plurality of second elements may be provided in each of a plurality of grooves of a transfer substrate to be spaced apart from each other at a preset interval, and the plurality of second elements spaced apart from each other by the preset interval may be transferred onto the first substrate.

In the transferring, the first substrate has a plurality of grooves spaced apart from each other by a preset distance, and the plurality of second elements may be transferred to each of the plurality of grooves by the fluidic self-assembly method.

A thickness of the shuttle layer may be greater than a thickness of the element layer.

A planar shape of the element layer may have a symmetrical structure, the electrode layer may include a plurality of electrodes provided on a same plane, and the plurality of electrodes may be symmetrical with respect to a center of the electrode layer.

A planar shape of the element layer may have an asymmetrical structure, and the electrode layer may include a plurality of electrodes provided on a same plane, and the plurality of electrodes may be provided in parallel.

The element layer may include a micro light-emitting device and a driving device configured to drive the micro light-emitting unit, and the driving device may be monolithically coupled to the micro light-emitting device.

The element layer may include a group III-V material or a two-dimensional material.

A size of the second element may be smaller than a size of the first element.

According to another aspect of an example embodiment, there is provided a hybrid element including a first element formed on a first substrate, and a second element formed on the first substrate and different from the first element, wherein the second element includes a shuttle layer configured to be grown on a second substrate formed of a material different from a material of the first substrate, an element layer which is provided on the shuttle layer and is configured to be grown on the shuttle layer, and an electrode layer provided on a surface of the element layer.

The first substrate may include a group IV material, the second substrate may include a group III-V material or sapphire, and the second substrate may be smaller than the first substrate.

A thickness of the shuttle layer may be greater than a thickness of the element layer, the shuttle layer may include a group III-V material, and the element layer may include a group III-V material or a two-dimensional material. The two-dimensional material comprises at least one of graphene, a carbon nanotube, hexagonal boron nitride (hBN), molybdenum disulfide ($MoS_2$), tungsten selenium ($WSe_2$), and transition metal dichalcogenides(TMDs).

The first element may include at least one of a CMOS, a memory, an integrated circuit, an optical sensor, and a solar cell, and the second element may include at least one of a light-emitting diode, a laser, a detector, and an electronic element.

A size of the second element may be smaller than a size of the first element.

A planar shape of the element layer may have a symmetrical structure, the electrode layer may include a plurality of electrodes provided on a same plane, and the plurality of electrodes may be symmetrical with respect to a center of the electrode layer.

A planar shape of the element layer may have an asymmetrical structure, and the electrode layer may include a plurality of electrodes provided on a same plane, and the plurality of electrodes being provided in parallel.

BRIEF DESCRIPTION OF THE DRAWINGS

The above and other aspects, features, and advantages of example embodiments will be more apparent from the following description taken in conjunction with the accompanying drawings, in which.

DETAILED DESCRIPTION

Figure 1:
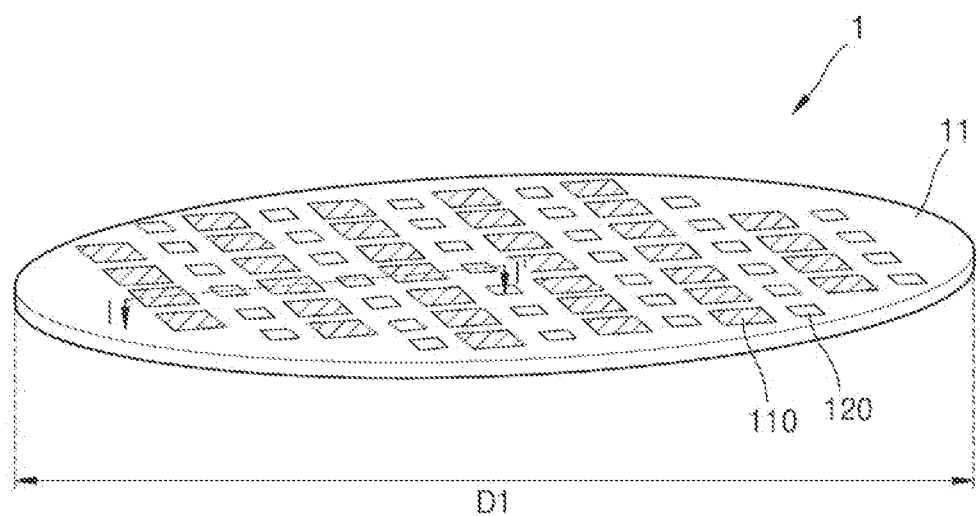
FIG. 1 is a diagram illustrating a hybrid element 1 according to an example embodiment.

Reference will now be made in detail to example embodiments of which are illustrated in the accompanying drawings, wherein like reference numerals refer to like elements throughout. In this regard, example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Hereinafter, a hybrid element according to various example embodiments will be described in detail with reference to the accompanying drawings. In the following drawings, like reference numerals refer to like elements, and sizes of elements in the drawings may be exaggerated for clarity and convenience of description. Although the terms such as "first" or "second" may be used herein to describe various elements, these elements should not be limited by these terms. These terms are only used to distinguish one element from another element.

An expression used in the singular encompasses the expression of the plural, unless it has a clearly different meaning in the context. In addition, when an element "includes" an element, unless there is a particular description contrary thereto, the element may further include other elements, not excluding the other elements. In the following drawings, the size or thickness of each element in the drawings may be exaggerated for clarity of description. Also, when a material layer is referred to as being "on" another substrate or layer, the material layer may be directly on the another substrate or layer, or a third layer may also be present therebetween. In addition, materials constituting each layer in the embodiments below are exemplary, and other materials than the described ones may also be used.

Also, the terms described in the specification, such as " . . . er (or)", " . . . unit", " . . . module", etc., denote a unit that performs at least one function or operation, which may be implemented as hardware or software or a combination thereof.

Particular implementations described in the embodiments are merely exemplary, and do not limit the scope of the present disclosure in any way. For the sake of conciseness, descriptions of related art electronic configurations, control systems, software, and other functional aspects of the systems may be omitted. In addition, the lines or connecting elements between elements shown in the drawings are intended to represent exemplary functional relationships and/or physical or logical couplings between the various elements, and many alternative or additional functional relationships, physical connections or logical connections may be present in a practical element.

The term "the" and other demonstratives similar thereto should be understood to include a singular form and plural forms.

The operations of a method may be performed in any suitable order unless otherwise indicated herein or otherwise clearly contradicted by context. In addition, all example terms (e.g., "such as" or "etc.") are used for the purpose of description and are not intended to limit the scope of the present disclosure unless defined by the claims.

Figure 2:
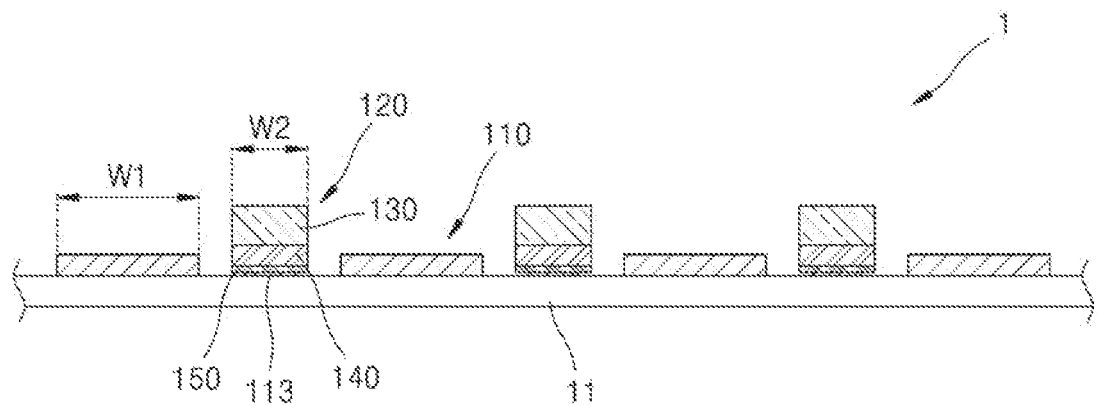
FIG. 2 is a cross-sectional view of I-I' in FIG. 1.

FIG. 1 is a diagram illustrating a hybrid element 1 according to an example embodiment. FIG. 2 is a cross-sectional view of I-I' in FIG. 1.

Referring to FIGS. 1 and 2, the hybrid element 1 according to an example embodiment includes a first substrate 11, and elements of different types arranged on the first substrate 11. In FIGS. 1 and 2, two types of elements, i.e., a first element 110 (hereinafter, also referred to as the plurality of first elements 110) and a second element 120 (hereinafter, also referred to as the plurality of second elements 120), are illustrated as examples of the elements on the first substrate 11. However, embodiments are not limited thereto, and three or more types of elements may be arranged.

The first substrate 11 may include a group IV material. For example, the first substrate 11 may be a silicon substrate. However, the material of the first substrate 11 is not necessarily limited to the group IV material, and may be any one of various substrates suitable for a large-area substrate, e.g., a glass substrate.

The size of the first substrate 11 may be greater than or equal to a preset size. For example, a size D1 of the first substrate 11 may be greater than or equal to 8 inches. For example, the size D1 of the first substrate 11 may be about 8 inches to about 12 inches. However, the size D1 of the first substrate 11 is not limited thereto, and may vary depending on its material.

Figure 3:
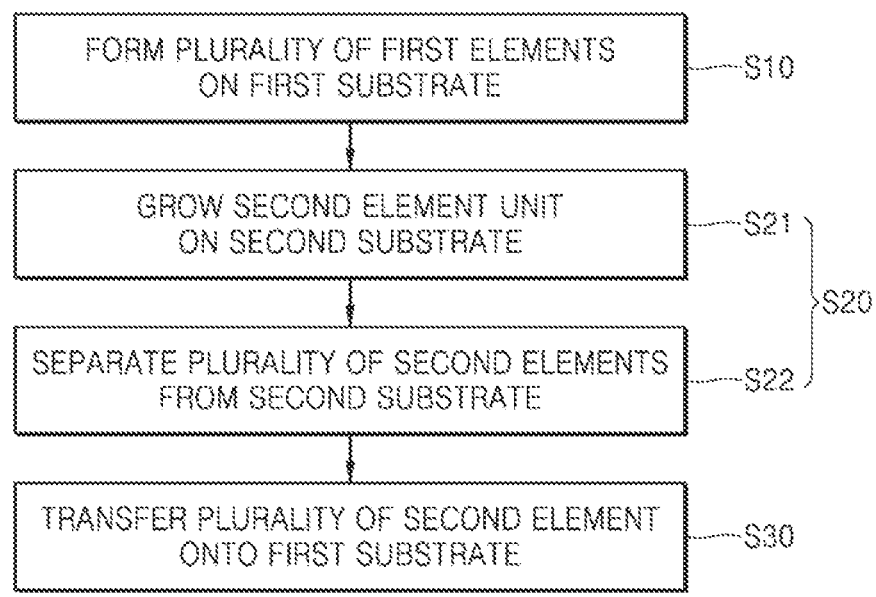
FIG. 3 is a flowchart illustrating a method of fabricating a hybrid element, according to an example embodiment.
Figure 4:
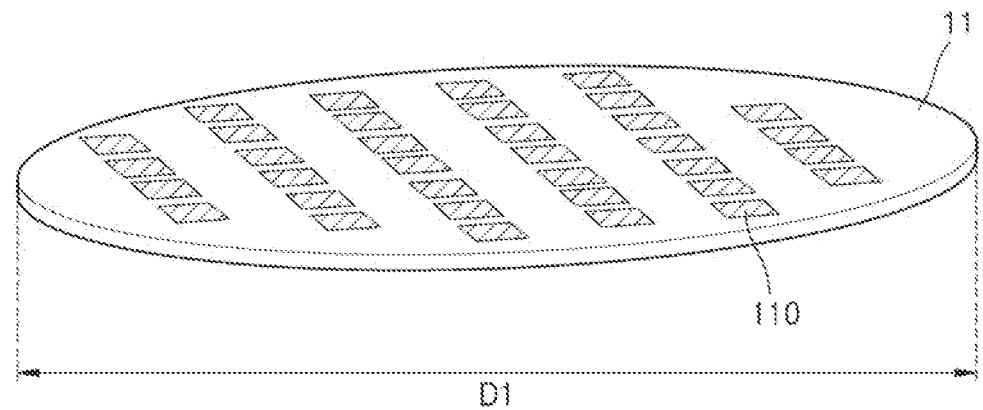
FIGS. 4 and 5 are diagrams illustrating a plurality of first elements formed on a first substrate.
Figure 5:
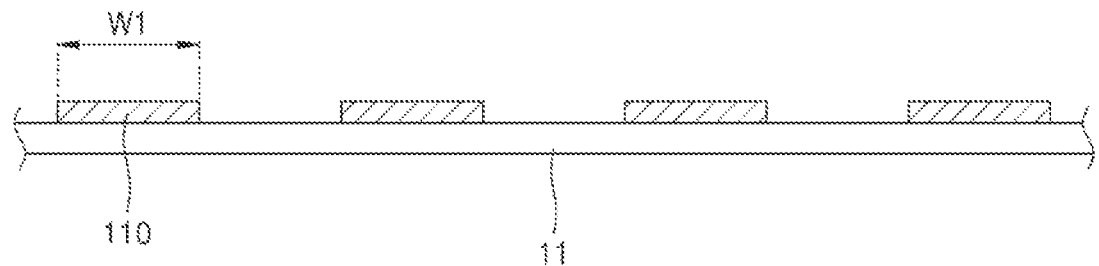

FIG. 3 is a flowchart illustrating a method of fabricating the hybrid element 1 according to an example embodiment, and FIGS. 4 and 5 are diagrams illustrating a plurality of first elements 110 formed on the first substrate 11.

Referring to FIGS. 3 to 5, the plurality of first elements 110 may be formed on the first substrate 11 (S10). The first element 110 may be an element that may be directly formed on the first substrate 11. For example, the first element 110 may be an element that may be formed on a silicon substrate. For example, the first element 110 may include at least one of a complementary metal-oxide semiconductor (CMOS), a memory, an integrated circuit, an optical sensor, and a solar cell. The optical sensor may be a silicon-based optical sensor. The first element 110 may be a CMOS image sensor. The integrated circuit may be a power management integrated circuit (PMIC), a radio-frequency integrated circuit (RFIC), or the like.

The plurality of first elements 110 may be arranged on the first substrate 11 to be spaced apart from each other. A preset space may be formed between the first elements 110, and thus the second element 120 may be arranged therebetween.

The first element 110 may be directly formed on the first substrate 11 by deposition or growth. The first element 110 may be manufactured by photoresist patterning, etching, or molding, but is not limited thereto.

Figure 6:
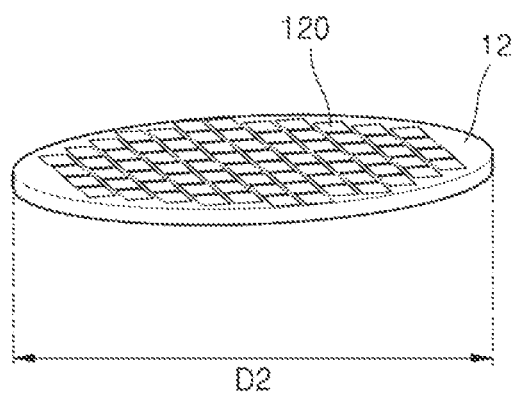
FIG. 6 is a diagram illustrating a plurality of second elements formed on a second substrate.

The second element 120 may be transferred onto the first substrate 11 and may be of a different type from the first element 110. The plurality of second elements 120 transferred onto the first substrate 11 may be electrically connected to each other to perform one function. As illustrated in FIG. 6, the second element 120 may be grown and formed on a second substrate 12 formed of a material different from that of the first substrate 11.

Figure 7:
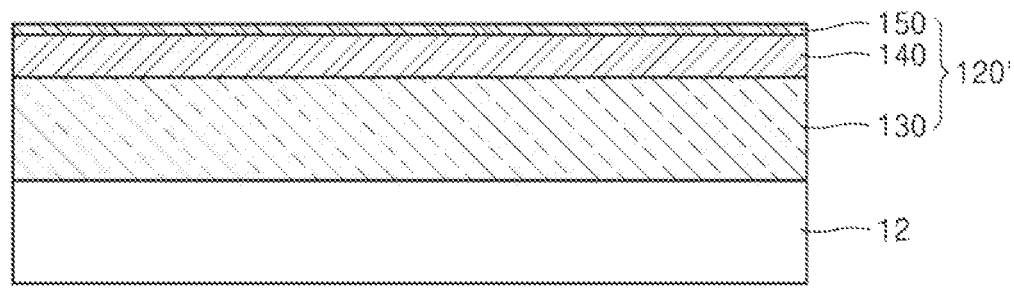
FIGS. 7 and 8 are diagrams illustrating a process of growing a plurality of second elements on a second substrate according to an example embodiment.
Figure 8:
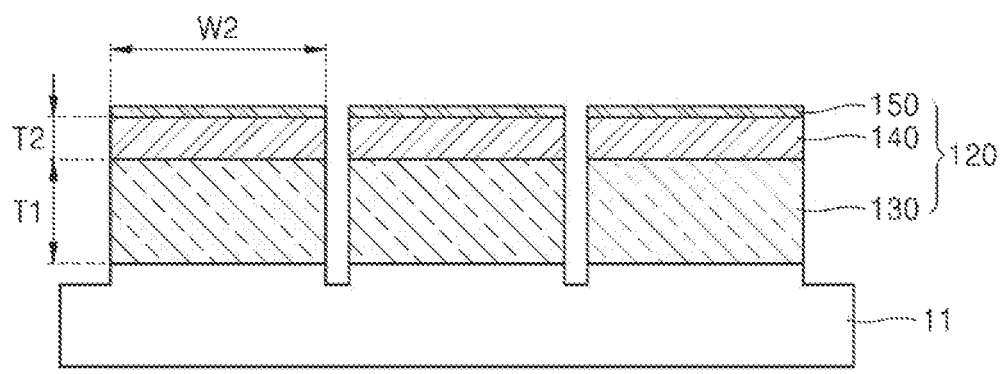
Figure 9:
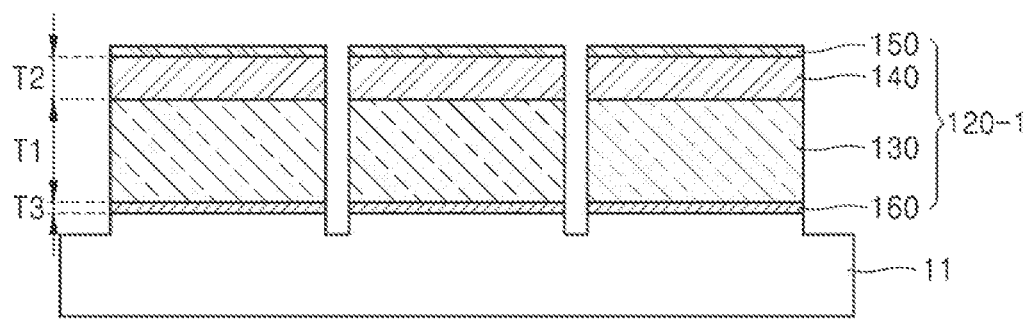
FIG. 9 is a diagram illustrating a process of growing a plurality of second elements on a second substrate according to an example embodiment.

FIGS. 7 and 8 are diagrams illustrating a process of growing the plurality of second elements 120 on the second substrate 12 according to an example embodiment, and FIG. 9 is a diagram illustrating a process of growing the plurality of second elements 120 on the second substrate 12 according to an example embodiment.

A process of manufacturing the plurality of second elements 120 (S20) will be described with reference to FIGS. 3 and 7 to 9.

Referring to FIGS. 3 and 7, first, a second element unit 120' may be grown on the second substrate 12 (S21). To this end, a shuttle layer 130 may be grown on the second substrate 12, and then an element layer 140 may be grown on the shuttle layer 130. For example, the shuttle layer 130 may be formed on the second substrate 12 by epitaxial growth, and the element layer 140 may be formed on the shuttle layer 130 by epitaxial growth. An electrode layer 150 may be formed on the element layer 140. In another example embodiment, the element layer 140 may be formed on the shuttle layer 130 by deposition rather than epitaxial growth.

The second substrate 12 may include a group III-V material or sapphire. For example, indium phosphide (InP) or gallium arsenide (GaAs) may be used as the group III-V material. However, the material of the second substrate 12 is not limited thereto, and various modifications with any material that has characteristics, e.g., size, different from those of the first substrate 11, may be possible.

A size D2 of the second substrate 12 may be less than the size D1 of the first substrate 11. The size D2 of the second substrate 12 may be 6 inches or less. For example, the size D2 of the second substrate 12 may be about 2 inches to about 6 inches.

The shuttle layer 130 may include a group III-V material. For example, the shuttle layer 130 may include at least one of gallium nitride (GaN), aluminum nitride (AlN), indium phosphide (InP), indium gallium arsenide (InGaAs), or gallium arsenide (GaAs).

The shuttle layer 130 supports the element layer 140, which is relatively thin, in a process of transferring the second element 120. A thickness T1 of the shuttle layer 130 is greater than a thickness T2 of the element layer 140. The thickness T1 of the shuttle layer 130 may be 100 um or less.

The element layer 140 may include a group III-V material. For example, the element layer 140 may include at least one of gallium nitride and gallium arsenide. However, the material of the element layer 140 is not limited thereto, and may vary. For example, the element layer 140 may include a two-dimensional material. The two-dimensional material may include at least one of graphene, a carbon nanotube, hexagonal boron nitride (hBN), molybdenum disulfide ($MoS_2$), tungsten selenium ($WSe_2$), and transition metal dichalcogenides(TMDs).

The electrode layer 150 may include a conductive material. For example, the electrode layer 150 may include silver (Ag), gold (Au), aluminum (Al), chromium (Cr), nickel (Ni), or an alloy thereof. As another example, the electrode layer 150 may include a transparent conductive material that has conductivity and transmits light. For example, the electrode layer 150 may include indium tin oxide (ITO), ZnO, indium zinc oxide (IZO), indium gallium zinco oxide (IGZO, or the like.

Next, referring to FIGS. 3 and 8, the second element unit 120' formed on the second substrate 12 may be separated into the plurality of second elements 120 (S22). For example, the plurality of second elements 120 may be separated from the second substrate 12 by patterning the second element unit 120' to a preset size and then removing the second substrate 12. As illustrated in FIG. 8, in a state in which the second element unit 120' is patterned, the plurality of second elements 120 may be formed by removing a portion connected to the second element 120 of the second substrate 12 by using a property that the speed of etching in the horizontal direction of the second substrate 12 is faster than that in the vertical direction of the second substrate 12.

However, a method of separating the plurality of second elements 120 is not limited thereto, and various methods may be used. For example, the second element unit 120' may be separated into the plurality of second elements 120 by a cutting method.

In the above-described example embodiments, a structure in which the shuttle layer 130 is grown on the second substrate 12 is illustrated, but embodiments are not limited thereto. For example, as illustrated in FIG. 9, in a second element 120-1, a sacrificial layer 160 may be arranged between the shuttle layer 130 and the second substrate 12. The sacrificial layer 160 may include a group III-V material. For example, the sacrificial layer 160 may include at least one of gallium nitride (GaN), aluminum nitride (AlN), indium phosphide (InP), indium gallium arsenide (InGaAs), or gallium arsenide (GaAs). A thickness T3 of the sacrificial layer 160 may be less than the thickness T2 of the element layer 140. By removing the sacrificial layer 160, the plurality of second elements 120 may be separated from the second substrate 12. In this case, the sacrificial layer 160 may remain in the separated second element 120.

A size W2 of the second element 120 may be less than a size W1 (see FIG. 2) of the first element 110. The second element 120 may be a micro semiconductor chip. The micro semiconductor chip may have a size in micrometers. For example, the micro semiconductor chip may have a size of less than 1000 um, for example, less than or equal to 500 um, less than or equal to 200 um, or less than or equal to 100 um. For example, the second element 120 may be a micro light-emitting element.

However, the second element 120 is not limited thereto, and may be any one of various elements that are able to be grown on a substrate including a group III-V material or sapphire. The second element 120 may include at least one of a light-emitting element, a laser, a detector, and an electronic element. The detector may be an infrared sensor. For example, the detector may be a short-wave infrared (SWIR) sensor or a long-wave infrared (LWIR) sensor. The electronic element may be a transistor. For example, the electronic element may be a high-electron-mobility transistor, a field-effect transistor, a thin-film transistor, or an insulated-gate bipolar transistor. However, the electronic element is not limited thereto, and may vary. For example, the electronic element may be a radio-frequency (RF) device, a thin-film battery, an integrated circuit, a transceiver, a memory, a voltage regulator, an amplifier, a switch, an electro-optical sensor, or the like.

The second element 120 may include the shuttle layer 130 that is able to be grown on the second substrate 12 formed of a material different from that of the first substrate 11, the element layer 140 that is arranged on the shuttle layer 130 and is able to be grown on the shuttle layer 130, and the electrode layer 150 arranged on one surface of the element layer 140.

The plurality of second elements 120, which are separated from the second substrate 12, may have an aspect ratio to allow them to be transferred in a constant posture. Here, the aspect ratio is a ratio of a width to a thickness of the second elements 120. The aspect ratio of the second element 120 may be greater than 1 and less than or equal to 30.

The shuttle layer 130 of the second element 120 may have a shape that allows the shuttle layer 130 to support the element layer 140 and the second element 120 to be transferred in the constant posture. For example, the aspect ratio of the shuttle layer 130 may be slightly greater than the aspect ratio of the second element 120. For example, the aspect ratio of the shuttle layer 130 may be greater than 1 and less than 40.

The aspect ratio of the element layer 140 of the second element 120 is greater than the aspect ratio of the shuttle layer 130. For example, the aspect ratio of the element layer 140 may be 3 to 150.

Because the shuttle layer 130, the element layer 140, and the electrode layer 150 of the second element 120 have substantially the same materials and thicknesses as those of the shuttle layer 130, the element layer 140, and the electrode layer 150 of the second element unit 120' that is not yet separated into the plurality of second elements 120, a description thereof will be omitted.

Next, the plurality of second elements 120 may be transferred onto the first substrate 11 (S30). During the transferring, the plurality of second elements 120 may be arranged to be spaced apart from each other, by a fluidic self-assembly method.

Figure 10:
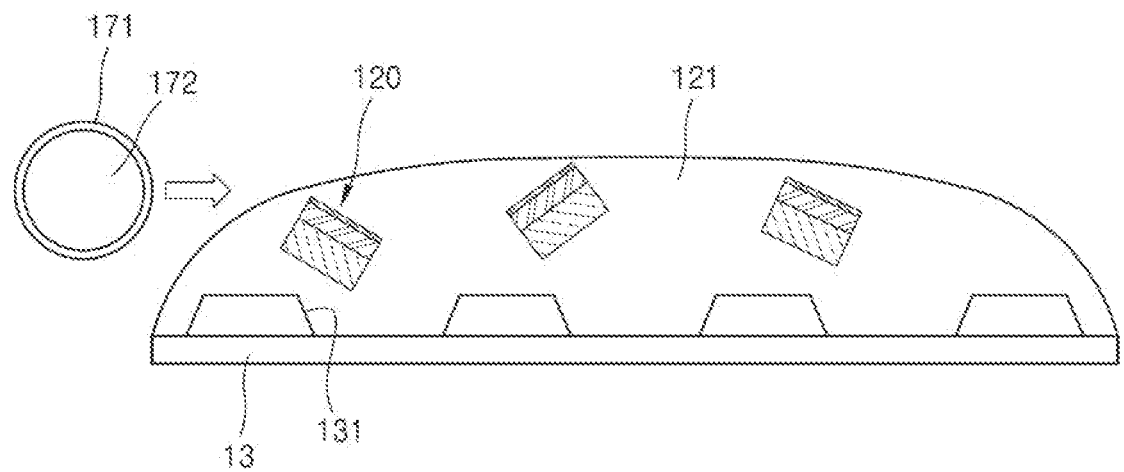
FIGS. 10 and 11 are diagrams illustrating an example of arranging a plurality of second elements by a fluidic self-assembly method.
Figure 11:
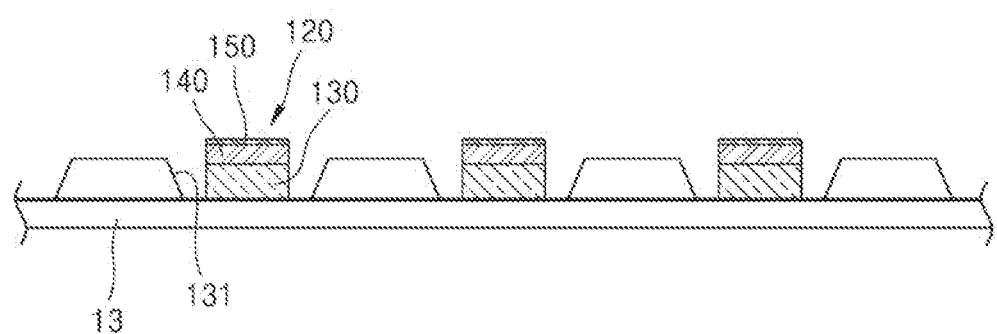

FIGS. 10 and 11 are diagrams illustrating an example of arranging the plurality of second elements 120 by the fluidic self-assembly method.

For example, referring to FIGS. 10 to 11, the plurality of second elements 120 are transferred onto a transfer substrate 13. The transfer substrate 13 includes a plurality of grooves 131 (hereinafter, also referred to as the groove 131) for arranging the plurality of second elements 120.

To transfer the second element 120, a liquid 121 may be supplied to at least the groove 131. The liquid 121 may be any type of liquid that does not corrode or damage the second element 120. The liquid 121 may include, for example, water, ethanol, alcohol, polyol, ketone, halocarbon, acetone, a flux, an organic solvent, or a combination thereof. The organic solvent may include, for example, isopropyl alcohol (IPA). The liquid 121 is not limited thereto, and may vary.

A method of supplying the liquid 121 to the groove 131 may be, for example, a spray method, a dispensing method, an inkjet dot method, a method of flowing the liquid 121 onto the transfer substrate 13, or the like. The amount of the liquid 121 may be variously adjusted to fit the groove 131 or to overflow the groove 131.

The plurality of second elements 120 may be supplied to the transfer substrate 13. The second element 120 may be directly sprayed on the transfer substrate 13 without the liquid 121, or may be supplied in a state of being included in a suspension. As a method of supplying the second element 120 included in the suspension, a spray method, a dispensing method of dropping droplets of the liquid 121, an inkjet dot method of discharging the liquid 121 as in a printing method, a method of flowing the suspension onto the transfer substrate 13, and the like may be variously used. Then, the transfer substrate 13 may be scanned with an absorbent 171 capable of absorbing liquid. The absorbent 171 may be formed of any material capable of absorbing the liquid 121, and the shape or structure thereof is not limited. The absorbent 171 may include, for example, a fabric, a tissue, a polyester fiber, paper, or a wiper. The absorbent 171 may be used alone without other auxiliary equipment, but is not limited thereto, and may be coupled to a support 172 to facilitate the scanning of the transfer substrate 13. The support 172 may vary in shape and structure to be suitable for scanning the transfer substrate 13. The support 172 may have the shape of, for example, a rod, a blade, a plate, a wiper, or the like. The absorbent 171 may be provided on any one surface of the support 172 or may surround the circumference of the support 172.

The absorbent 171 may be used to scan the transfer substrate 13 while pressing the transfer substrate 13 with an appropriate pressure. The scanning may include absorbing the liquid 121 while the absorbent 171 is in contact with the transfer substrate 13 and passes through the plurality of grooves 131. The scanning may be performed by using the absorbent 171 in various manners, for example, a sliding manner, a rotating manner, a translating manner, a reciprocating manner, a rolling manner, a spinning manner, and/or a rubbing manner, and may be performed regularly or irregularly. The scanning may be performed by moving the transfer substrate 13 instead of moving the absorbent 171, in which case, the scanning may also be performed in a sliding, rotating, translating, reciprocating, rolling, spinning, and/or rubbing manner. The scanning may be performed by cooperation between the absorbent 171 and the transfer substrate 13.

As described above, the plurality of second elements 120 may be supplied onto the transfer substrate 13 together with the liquid 121, and the plurality of second elements 120 may be respectively arranged in the plurality of grooves 131 of the transfer substrate 13 by applying an external force to the plurality of second elements 120 by using the absorbent 171 or the like. By removing the liquid 121, the second element 120 may be arranged in each of the plurality of grooves 131 of the transfer substrate 13. The plurality of second elements 120 arranged in the plurality of grooves 131 are spaced apart from each other by a preset interval. The second element 120 may be arranged such that the electrode layer 150 faces upward.

The size of the transfer substrate 13 may be greater than the size D2 of the second substrate 12. Accordingly, the plurality of second elements 120 may be more easily arranged in an area relatively larger than the second substrate 12. However, the diameter of the transfer substrate 13 is not limited thereto, and may be the same as the size D2 of the second substrate 12.

Figure 12:
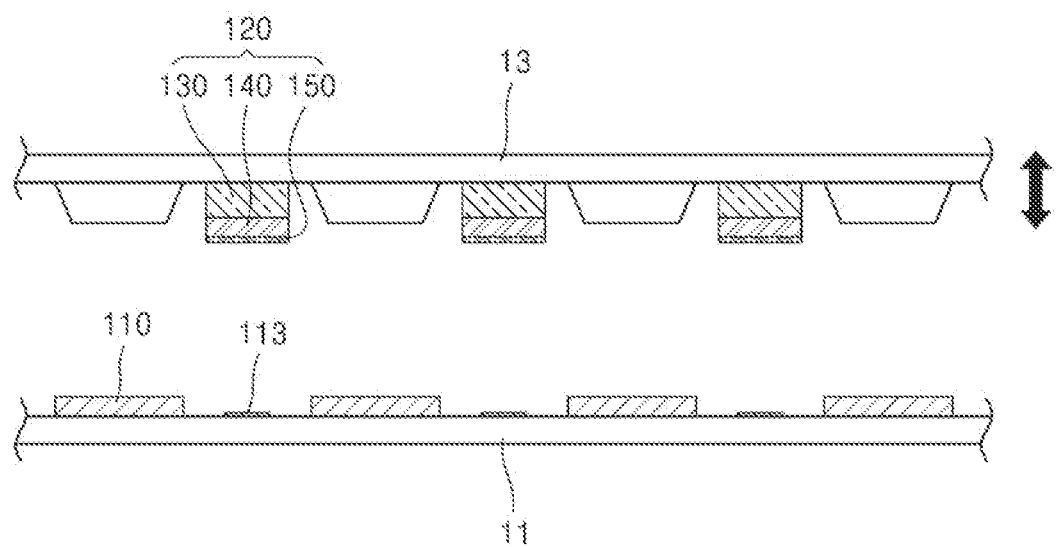
FIG. 12 is a diagram illustrating a process of transferring a plurality of second elements onto a first substrate according to an example embodiment.

FIG. 12 is a diagram illustrating a process of transferring the second element 120 onto the first substrate 11.

Referring to FIG. 12, after the transfer substrate 13 on which the plurality of second elements 120 are arranged to be spaced apart from each other is turned upside down and then aligned above the first substrate 11, the plurality of second elements 120 may be transferred onto the first substrate 11.

For example, in a state in which a plurality of adhesive portions 113 (hereinafter, also referred to as the adhesive portion 113) are arranged on the first substrate 11, the transfer substrate 13 may be moved to approach the first substrate 11, to bring the second element 120 into contact with the adhesive portion 113. Then, the transfer substrate 13 may be moved to be separated from the first substrate 11, and thus the second element 120 may be arranged on the adhesive portion 113 of the first substrate 11. Accordingly, as illustrated in FIG. 2, in the hybrid element 1 according to an example embodiment, the electrode layer 150 of the second element 120 is attached to the adhesive portion 113 and is arranged to face downward.

The size D1 of the first substrate 11 may be greater than or equal to the size of the transfer substrate 13. The size D1 of the first substrate 11 may be greater than or equal to the size D2 of the second substrate 12.

The hybrid element 1 according to the above-described example embodiment may be divided into unit regions including preset numbers of first elements 110 and second elements 120 on the first substrate 11, to be used in an electronic element.

Although an example, in which the transfer substrate 13 is used in the process of transferring the second element 120 onto the first substrate 11, is given in describing the transferring process according to FIGS. 10 to 12, the transferring process is not limited thereto. For example, the plurality of second elements 120 may be directly transferred onto the first substrate 11 without using the transfer substrate 13.

Figure 13:
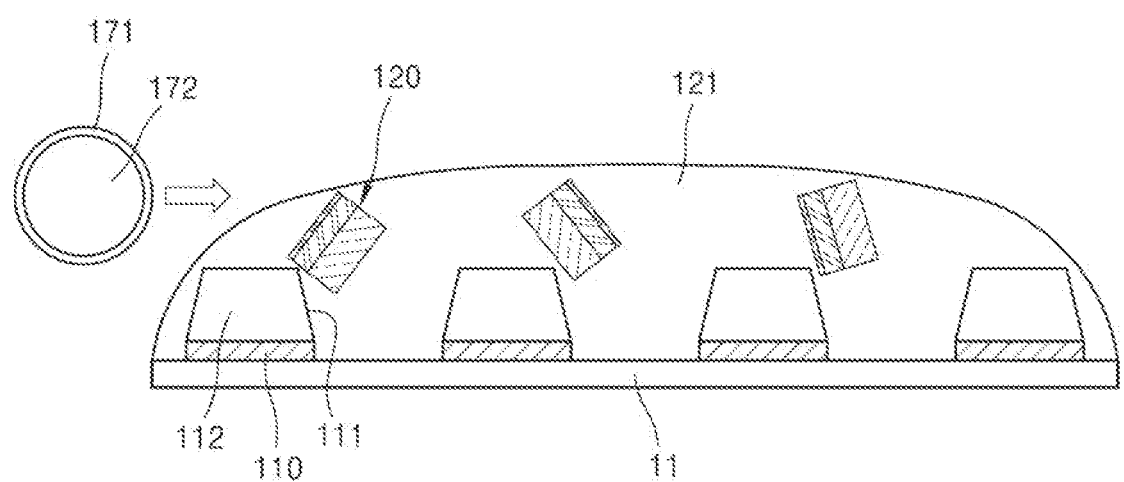
FIGS. 13 and 14 are diagrams illustrating a process of transferring a plurality of second elements onto a first substrate according to another example embodiment.
Figure 14:
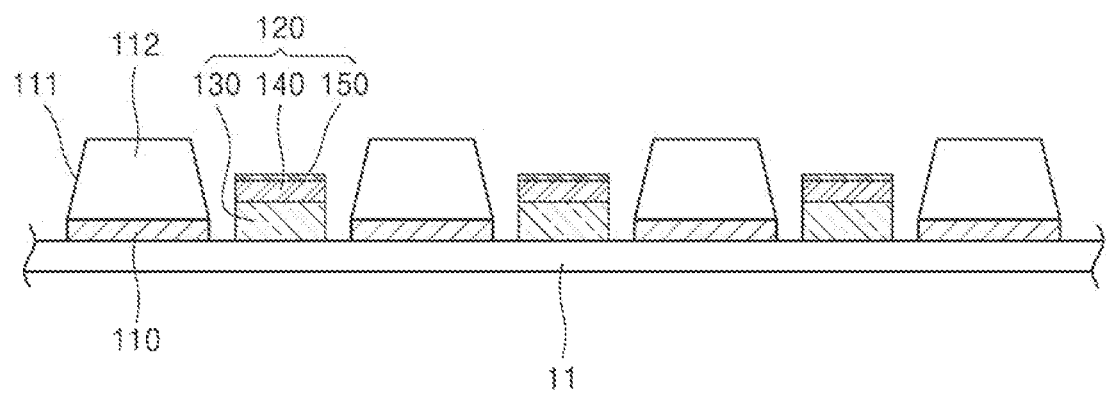

FIGS. 13 and 14 are diagrams illustrating a process of directly transferring the plurality of second elements 120 onto the first substrate 11, according to another embodiment.

Referring to FIGS. 13 and 14, the first substrate 11 may include a first element 110 and a partition wall 112 for defining a groove 111 into which the second element 120 may be inserted. The partition wall 112 may be arranged on the first element 110. However, the arrangement of the partition wall 112 is not limited thereto, and may be variously modified. By the fluidic self-assembly method, i.e., by sequentially or simultaneously supplying the liquid and the plurality of second elements 120 onto the first substrate 11 having the plurality of grooves 111, the plurality of second elements 120 may be transferred onto the first substrate 11. In this case, the second element 120 is arranged such that the electrode layer 150 faces upward.

The first substrate 11 of the hybrid element 1 manufactured according to FIGS. 1 to 14 may be divided into unit regions including preset numbers of first elements 110 and second elements 120, to be used in an electronic element.

The first element 110 and the second element 120 arranged on the first substrate 11 may be electrically connected to each other.

Figure 15:
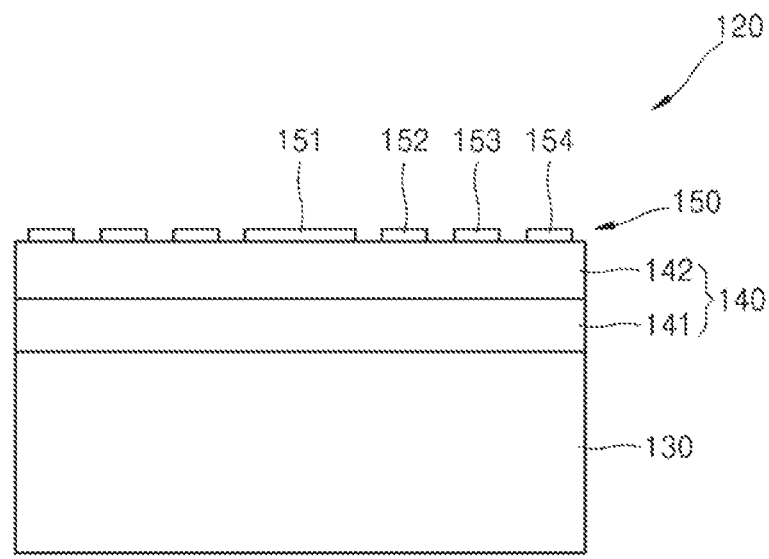
FIG. 15 is a diagram illustrating an example in which a second element is a micro light-emitting element according to the example embodiment.

FIG. 15 is a diagram illustrating an example in which the second element 120 is a micro light-emitting element according to the example embodiment. Referring to FIG. 15, the second element 120 includes the shuttle layer 130, the element layer 140, and the electrode layer 150. The element layer 140 may include a micro light-emitting unit 141 and a driving unit 142.

The micro light-emitting unit 141 may include a first semiconductor layer, a light-emitting layer, and a second semiconductor layer, which are sequentially stacked.

The first semiconductor layer may include a first-type semiconductor. For example, the first semiconductor layer may include an n-type semiconductor. The first semiconductor layer may include an n-type group III-V semiconductor such as n-GaN. The first semiconductor layer may have a single-layer or multi-layer structure.

The light-emitting layer may be provided on the top surface of the first semiconductor layer. The light-emitting layer may generate light as electrons and holes are combined with each other. The light-emitting layer may have a multi-quantum well (MQW) structure or a single-quantum well (SQW) structure. The light-emitting layer may include a group III-V semiconductor, for example, GaN.

The second semiconductor layer may be provided on the top surface of the light-emitting layer. The second semiconductor layer may include, for example, a p-type semiconductor. The second semiconductor layer may include a p-type group III-V semiconductor, for example, p-GaN. The second semiconductor layer may have a single-layer or multi-layer structure. According to another example embodiment, in the case where the first semiconductor layer includes a p-type semiconductor, the second semiconductor layer may include an n-type semiconductor.

The driving unit 142 may be monolithically coupled to the micro light-emitting unit 141. This may indicate that the micro light-emitting unit 141 and the driving unit 142 are integrally coupled to each other without an adhesive layer. The micro light-emitting unit 141 and the driving unit 142 integrally coupled to each other may be cut into sub-pixel units, and the micro light-emitting unit 141 and the driving unit 142 may have a same width.

The driving unit 142 may include a transistor, a capacitor, and the like. The layer including the driving unit 142 may include one of low-temperature polysilicon, low-temperature polyoxide, amorphous silicon (a-Si), and oxide.

The electrode layer 150 may include a plurality of electrodes 151, 152, 153, and 154 (hereinafter, also referred to as the first electrode 151, the second electrode 152, the third electrode 153, and the fourth electrode 154) arranged on a common plane. The plurality of electrodes 151, 152, 153, and 154 may be arranged on one surface of the element layer 140.

The plurality of electrodes 151, 152, 153, and 154 may include a reflective material to reflect light emitted from the light-emitting layer. The plurality of electrodes 151, 152, 153, and 154 may include, for example, Ag, Au, Al, Cr, Ni, or an alloy thereof. According to another example embodiment, the plurality of electrodes 151, 152, 153, and 154 may be formed as transparent electrodes to transmit light emitted from the light-emitting layer. The transparent electrode may include, for example, indium tin oxide (ITO), ZnO, indium zinc oxide (IZO), IGZO, or the like.

The driving unit 142 may include a transistor, a thin-film transistor, or a high-electron-mobility transistor (HEMT), for electrically driving the micro light-emitting unit 141. The plurality of electrodes 151, 152, 153, and 154 may be, for example, source electrodes, drain electrodes, and gate electrodes constituting such transistors. According to another example embodiment, the driving unit 142 may include a capacitor. The plurality of electrodes may be electrodes constituting the capacitor. The driving unit 142 may include, for example, two or more transistors and one or more capacitors, but is not limited thereto. The two transistors may include a driving transistor for supplying a current to the element layer 140 and a switching transistor for performing a switching function.

For example, the planar shape of the element layer 140 may have a symmetrical structure, and the plurality of electrodes 151, 152, 153, and 154 arranged thereon may have a symmetrical shape with respect to the electrode layer 150.

Figure 16:
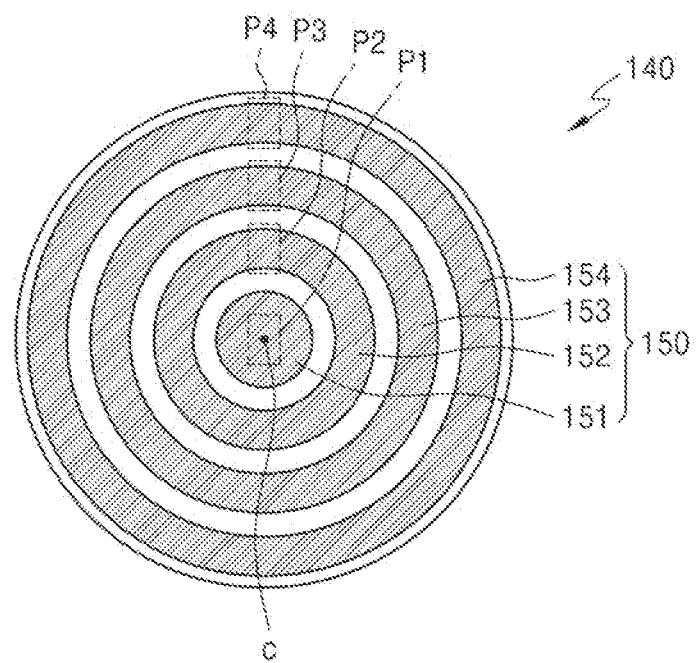
FIGS. 16, 17, 18, 19, 20 and 21 are diagrams illustrating examples of an electrode layer of a second element according to an example embodiment.

FIG. 16 is a plan view of the plurality of electrodes 151, 152, 153, and 154 of the electrode layer 150. The plurality of electrodes 151, 152, 153, and 154 may be at different radial positions or at different distances from a center c of the electrode layer 150. The electrode layer 150 may include the first electrode 151 at the center c, and the second, third, and fourth electrodes 152, 153, and 154, that have the shape of a closed loop, and arranged from the circumference of the first electrode 151. In this case, the electrode layer 150 may include the second, third, and fourth electrodes 152, 153, and 154 that have the shape of a closed loop, without the first electrode 151. As illustrated in FIG. 16, the plurality of electrodes 151, 152, 153, and 154 may have a symmetrical structure. For example, the plurality of electrodes 151, 152, 153, and 154 may have a linearly symmetrical structure, an origin-based symmetrical structure, or a rotational symmetrical structure, but are not limited thereto.

FIG. 16 illustrates an example in which the electrode layer 150 has a concentric circular structure. The concentric circular structure may include the first electrode 151 having a circular shape, and the second, third, and fourth electrodes 152, 153, and 154 that have a ring shape, share a common center, and are arranged from the circumference of the first electrode 151. In the case of the electrode layer 150 configured as described above, electrode pads may be connected to the electrode layer 150 regardless of a direction of transfer of the second element 120 when the second element 120 is transferred. For example, in the case where the electrode layer 150 includes the first, second, third, and fourth electrodes 151, 152, 153, and 154, and a first electrode pad p1, a second electrode pad p2, a third electrode pad p3, and a fourth electrode pad p4 are provided, the first electrode 151 may be connected to the first electrode pad p1, the second electrode 152 may be connected to the second electrode pad p2, the third electrode 153 may be connected to the third electrode pad p3, and the fourth electrode 154 may be connected to the fourth electrode pad p4. In the case where the electrode layer 150 has a concentric structure, the first, second, third, and fourth electrodes 151, 152, 153, and 154 may be connected to the corresponding electrode pads p1, p2, p3, and p4, respectively, when the second element 120 is transferred to the transfer substrate 13 in any direction. As described above, the electrode layer 150 may be connected to the corresponding electrode pads regardless of the direction of transfer of the second element 120.

Figure 17:
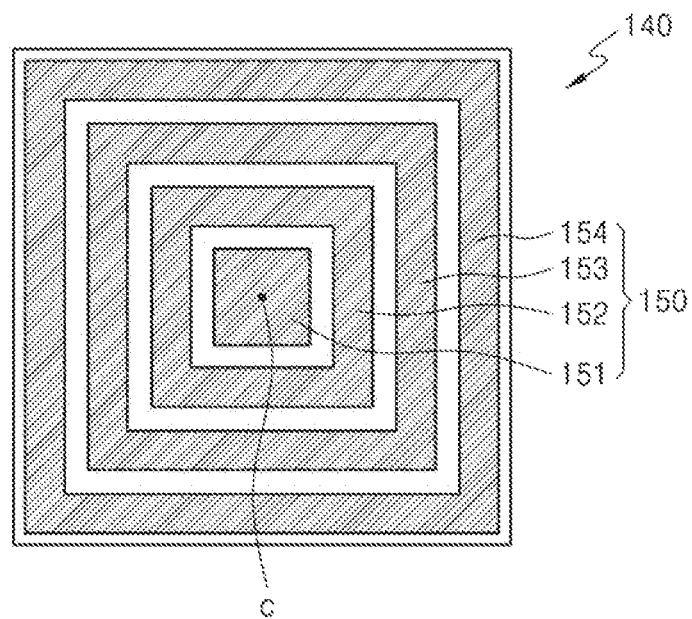

FIG. 17 illustrates another example of the electrode layer 150. The electrode layer 150 may have a concentric quadrangular structure. The concentric quadrangular structure may include the first electrode 151 having a quadrangular shape and provided at the center c of the electrode layer 150, and the second, third, and fourth electrodes 152, 153, and 154, that have a quadrangular ring shape, share a common center, and arranged from the circumference of the first electrode 151.

Figure 18:
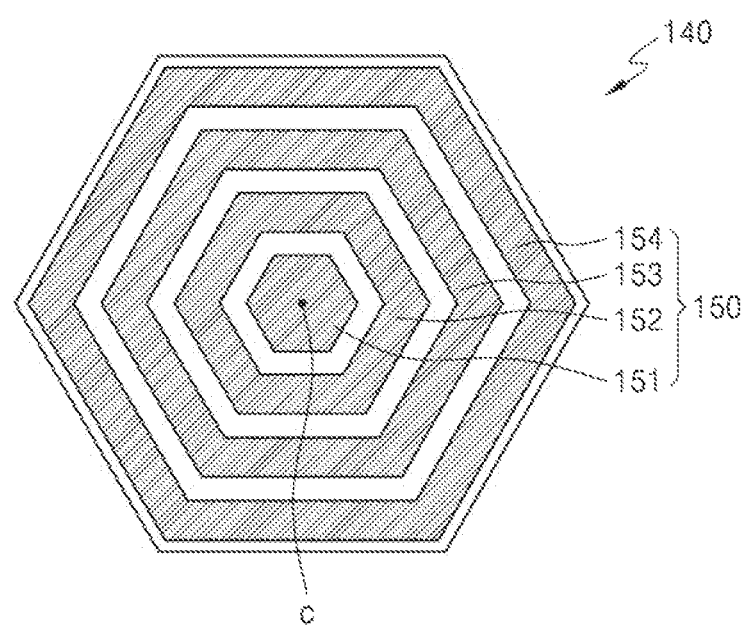

FIG. 18 illustrates another example of the electrode layer 150. The electrode layer 150 may have a concentric hexagonal structure. The concentric hexagonal structure may include the first electrode 151 having a hexagonal shape and provided at the center c of the electrode layer 150 and the second, third, and fourth electrodes 152, 153, and 154, that have a hexagonal ring shape, share a common center, and arranged from the circumference of the first electrode 151.

Figure 19:
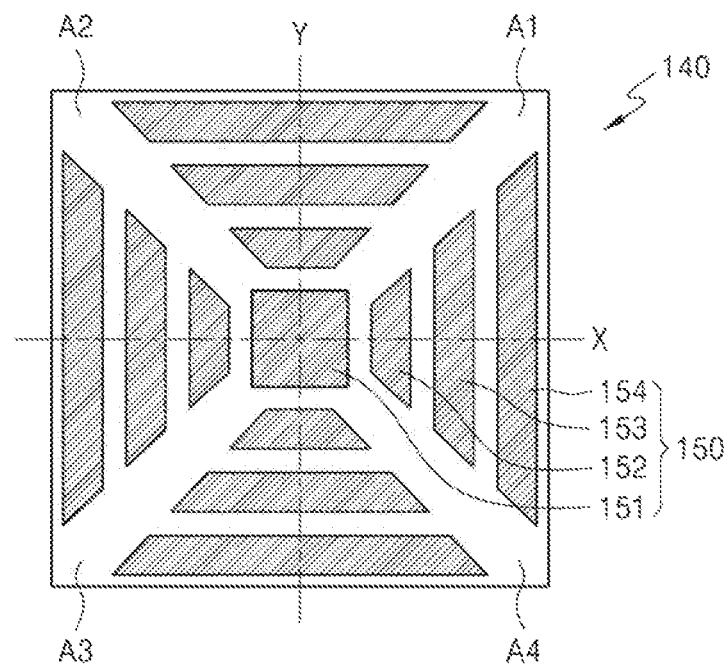

FIG. 19 illustrates another example of the electrode layer 150. The electrode layer 150 may have a quartered concentric quadrangular structure. Here, the term quartered does not necessarily indicate being divided into quarters with the same size. The electrode layer 150 may have a first quadrant A1, a second quadrant A2, a third quadrant A3, and a fourth quadrant A4, which are defined by a first axis X and a second axis Y that perpendicularly intersect each other at the center c. The first, second, third, and fourth electrodes 151, 152, 153, and 154 may be provided in the first quadrant A1, the second quadrant A2, the third quadrant A3, and the fourth quadrant A4, respectively. One or two of first, second, third, and fourth electrodes 151, 152, 153, and 154 may be provided in each quadrant. The electrode layer 150 may be symmetrical with respect to the first axis X and the second axis Y.

Figure 20:
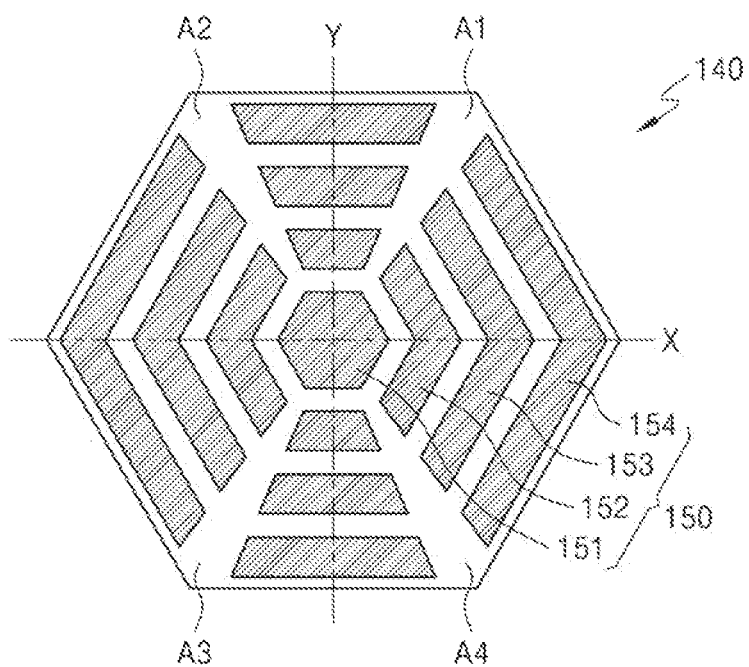

FIG. 20 illustrates another example of the electrode layer 150. The electrode layer 150 may have a quartered concentric hexagonal structure. Here, the term quartered does not necessarily indicate being divided into quarters with the same size. Although FIG. 20 illustrates an example in which a concentric hexagonal structure is divided into four sections, the concentric hexagonal structure may be divided into six sections. The electrode layer 150 may have the first quadrant A1, the second quadrant A2, the third quadrant A3, and the fourth quadrant A4, which are defined by the first axis X and the second axis Y that perpendicularly intersect each other at the center c. The electrode layer 150 may be provided in the first quadrant A1, the second quadrant A2, the third quadrant A3, and the fourth quadrant A4, respectively. The electrode layer 150 may be symmetrical with respect to the first axis X and the second axis Y. The electrode layer 150 may include the first, second, third, and fourth electrodes 151, 152, 153, and 154, and the first, second, third, and fourth electrodes 151, 152, 153, and 154 in each quadrant do not need to have the same shape.

Figure 21:
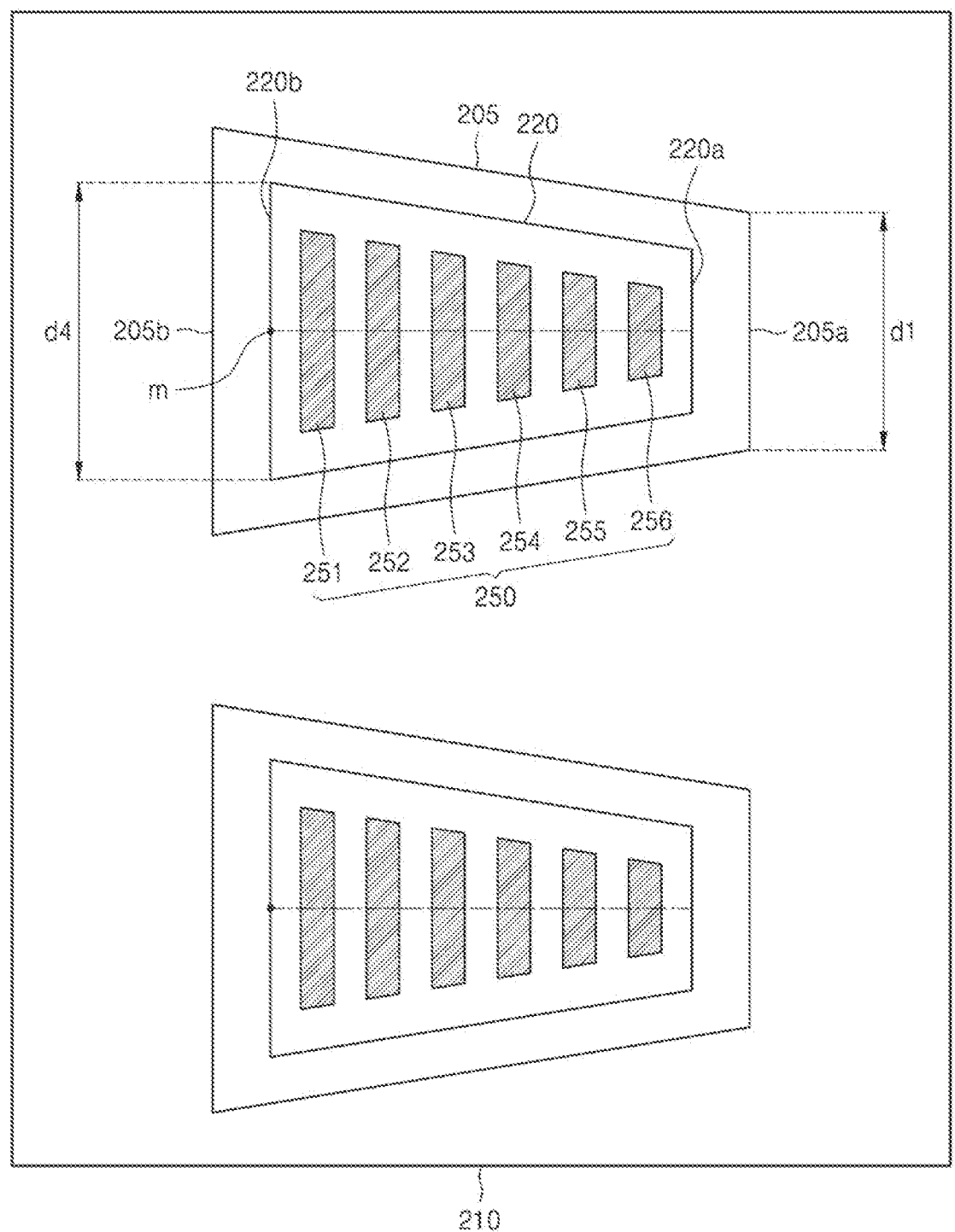

FIG. 21 illustrates an example of an electrode layer 250. In the example embodiment, the planar shape of a second element 220 may have an asymmetrical structure, and include a plurality of electrodes 251, 252, 253, 254, 255, and 256 (hereinafter, also referred to as the first electrode 251, the second electrode 252, the third electrode 253, the fourth electrode 254, the fifth electrode 255, and the sixth electrode 256) that are arranged in parallel. A transfer substrate 210 may include a plurality of grooves 205 (hereinafter, also referred to as the groove 205), and each of the plurality of grooves 205 may have an asymmetrical structure. The shape of the groove 205 may correspond to the shape of a second element 220. For example, the second element 220 and the groove 205 may have a trapezoidal shape. The groove 205 may have a first side 205*a* and a second side 205*b* that are parallel to each other, and the second element 220 may have a third side 220*a* and a fourth side 220*b* that are parallel to each other. A length d4 of the fourth side 220*b* may be greater than a length dl of the first side 205*a* such that the second element 220 may be transferred onto the groove 205 with a constant orientation. Accordingly, the second element 220 may be transferred to correspond to the shape of the groove 205. In addition, the electrode layer 250 may be positioned to have an orientation. For example, in the case where the electrode layer 250 includes the first, second, third, fourth, fifth, and sixth electrodes 251, 252, 253, 254, 255, and 256, the first, second, third, fourth, fifth, and sixth electrodes 251, 252, 253, 254, 255, and 256 may be arranged in parallel at different distances from any one point m of the second element 220. When the electrodes are arranged as described above, the first, second, third, fourth, fifth, and sixth electrodes 251, 252, 253, 254, 255, and 256 may be connected to corresponding electrode pads, respectively. In the example embodiment, when it is difficult to secure an area because of a large number of required electrodes compared to the size of the second element 220, a connection error rate with the electrode pads may be reduced while minimizing the electrode area.

Figure 22:
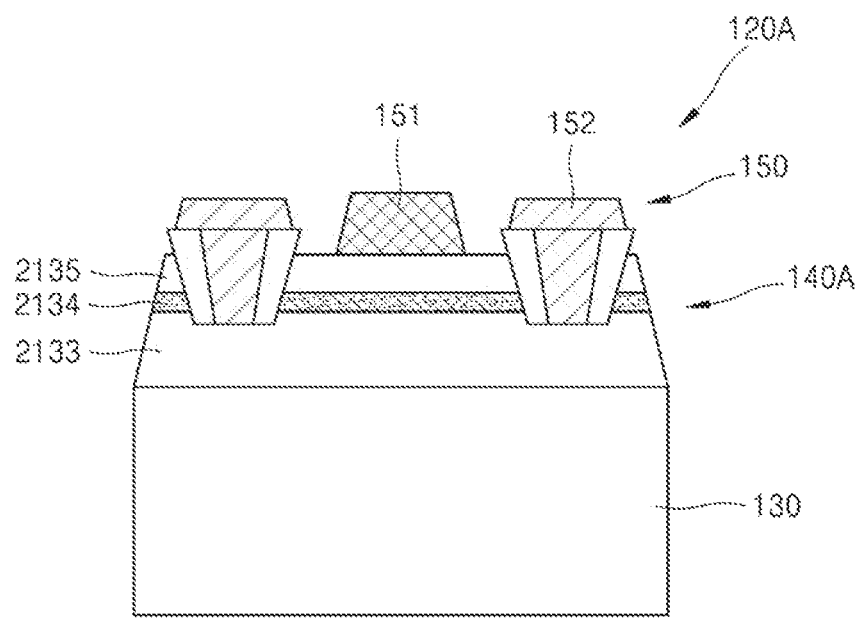
FIG. 22 is a diagram illustrating another example in which a second element is a micro light-emitting element according to an example embodiment.

The above example embodiments are described based on an example in which the element layer 140 of the second element 120 includes the micro light-emitting unit 141 and the driving unit 142. However, as illustrated in FIG. 22, an element layer 140A of a second element 120A may include a micro semiconductor chip without the driving unit 142. The element layer 140A may include an n-type semiconductor layer 2133, an active layer 2134, and a p-type semiconductor layer 2135. The n-type semiconductor layer 2133 may be an n-type GaN layer, and the p-type semiconductor layer 2135 may be a p-type GaN layer. The active layer 2134 may have, for example, a quantum well structure or a multi-quantum well structure.

Figure 23:
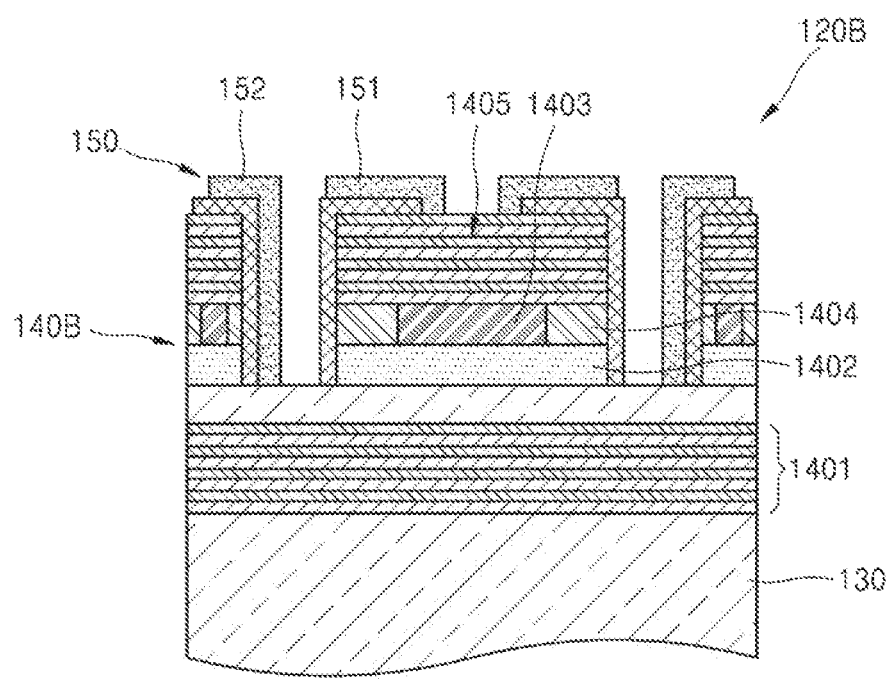
FIG. 23 is a diagram illustrating an example in which a second element is a laser according to an example embodiment.

As another example, referring to FIG. 23, a second element 120B may be a laser. For example, the second element 120B may be a vertical-cavity surface-emitting laser (VCSEL). An element layer 140B of the second element 120B may include a first reflective layer 1401, an active layer 1402 on the first reflective layer 1401, a current window 1403 for emitting a resonant laser, an oxide layer 1404 surrounding the current window 1403, and a second reflective layer 1405 on the current window 1403 and the oxide layer 1404. The first reflective layer 1401 may be a p-type distributed Bragg reflector, and the second reflective layer 1405 may be an n-type distributed Bragg reflector.

Figure 24:
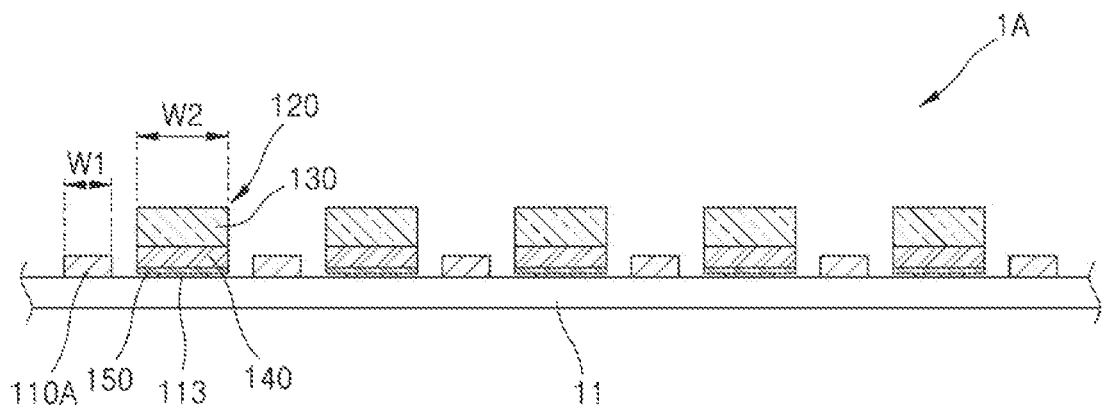
FIG. 24 is a diagram schematically illustrating a hybrid element, according to another example embodiment.

The above example embodiments are described based on examples in which the size of the second element 120, 120A, or 120B is smaller than the size of the first element 110. However, the relationship between the second element 120, 120A, or 120B and the first element 110 is not limited thereto, and as illustrated in FIG. 24, in a hybrid element 1A according to some example embodiments, a size W1 of the first element 110A may be less than a size W2 of the second element 120, if necessary.

The hybrid element 1 according to an example embodiment may be used in various elements.

Figure 25:
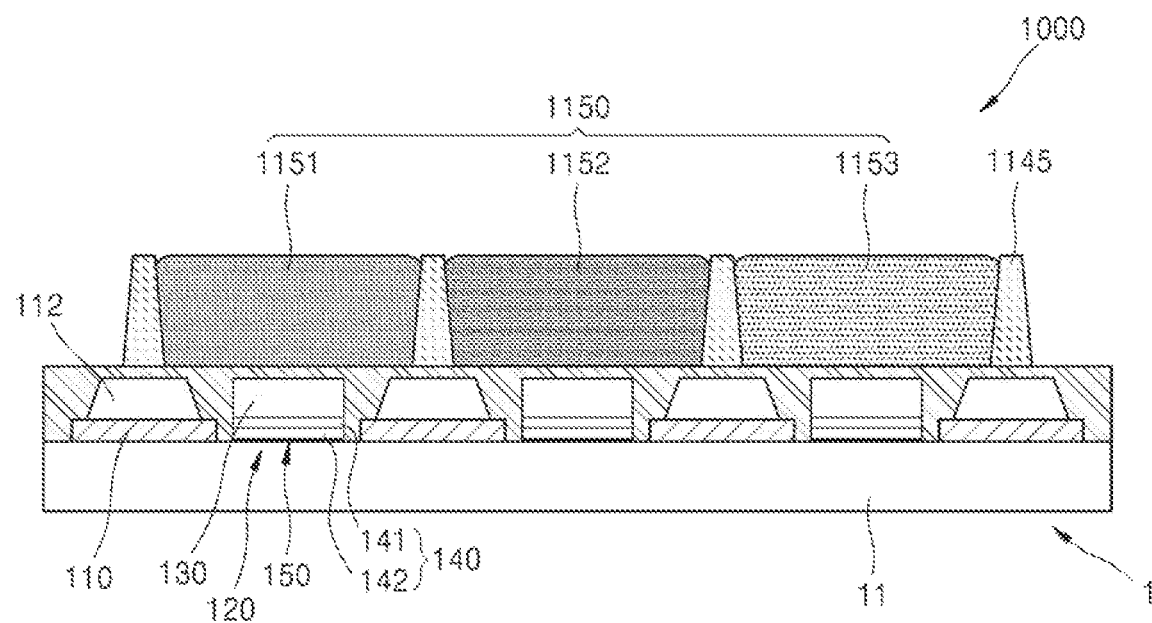
FIGS. 25 and 26 are diagrams schematically illustrating a display element, according to an example embodiment.
Figure 26:
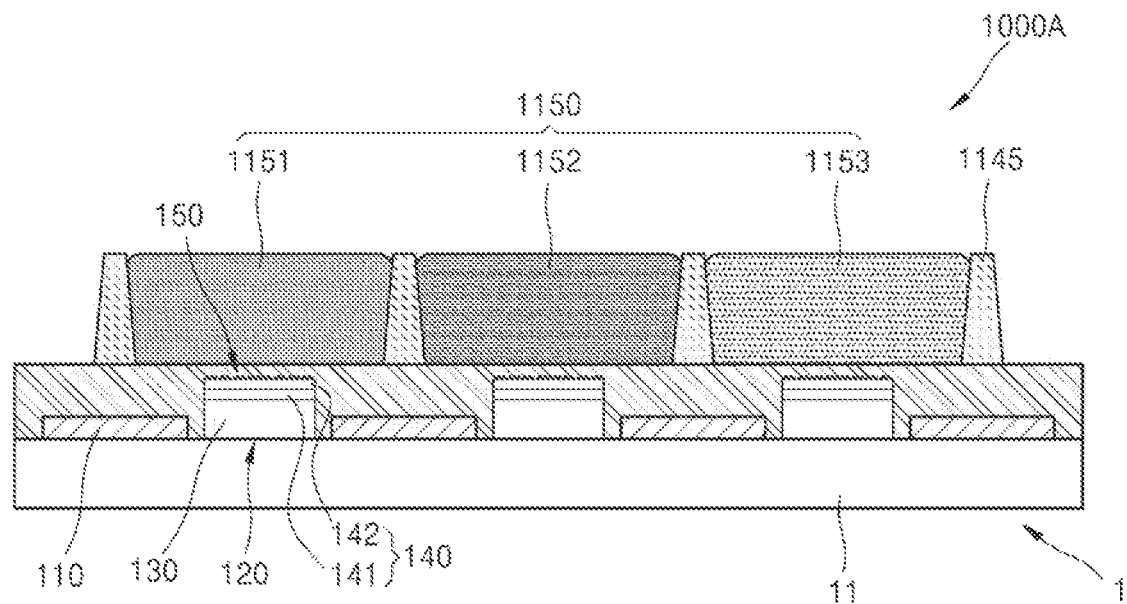

For example, the hybrid element 1 according to an example embodiment may be included in a display element. For example, as illustrated in FIGS. 25 and 26, display elements 1000A and 1000 may include the hybrid element 1 and a color conversion layer 1150 on the hybrid element 1.

The color conversion layer 1150 is between partition walls 1145. The second element 120 may emit first color light, for example, blue light. However, the light emitted from the second element 120 is not limited thereto, and may emit light having another wavelength which is able to excite the color conversion layer 1150.

The color conversion layer 1150 may include a first color conversion layer 1151 that transmits the light emitted from the second element 120 or converts the light into first color light, a second color conversion layer 1152 that converts the light into second color light, and a third color conversion layer 1153 that converts the light into third color light. The second color light may be green light, and the third color light may be red light.

In the case where the second element 120 emits blue light, the first color conversion layer 1151 may include a resin that transmits the blue light without light conversion. The second color conversion layer 1152 may convert the blue light emitted from the second element 120 into green light, and then emit the green light. The second color conversion layer 1152 may include quantum dots (QDs) that are excited by blue light to emit green light, and the quantum dot may have a core-shell structure having a core portion and a shell portion, or a shell-less particle structure. The core-shell structure may be a single-shell structure or a multi-shell structure, for example, a double-shell structure.

The quantum dot may include a group II-VI semiconductor, a group III-V semiconductor, a group IV-VI semiconductor, a group IV semiconductor, and/or a graphene quantum dot. The quantum dot may include, for example, cadmium (Cd), selenium (Se), zinc (Zn), sulfur (S), and/or indium phosphide (InP), and may have a diameter less than or equal to several tens of nm, for example, a diameter less than or equal to about 10 nm.

The second color conversion layer 1152 may include a phosphor that is excited by the blue light emitted from the second element 120 to emit green light.

The third color conversion layer 1153 may convert the blue light emitted from the second element 120 into red light, and then emit the red light. The third color conversion layer 1153 may include quantum dots having a preset size that are excited by blue light to emit red light, or may include a phosphor that is excited by the blue light emitted from the second element 120 to emit red light.

The display elements 1000 and 1000A may emit red, green, and blue light through the color conversion layer 1150. In this case, the hybrid element 1 may be applied to a red-green-blue (RGB) self-emission micro light-emitting diode (LED) TV. A display may be implemented by controlling the plurality of second elements 120. As described above, the plurality of second elements 120 transferred onto the first substrate 11 may be electrically connected to each other to perform one function.

Figure 27:
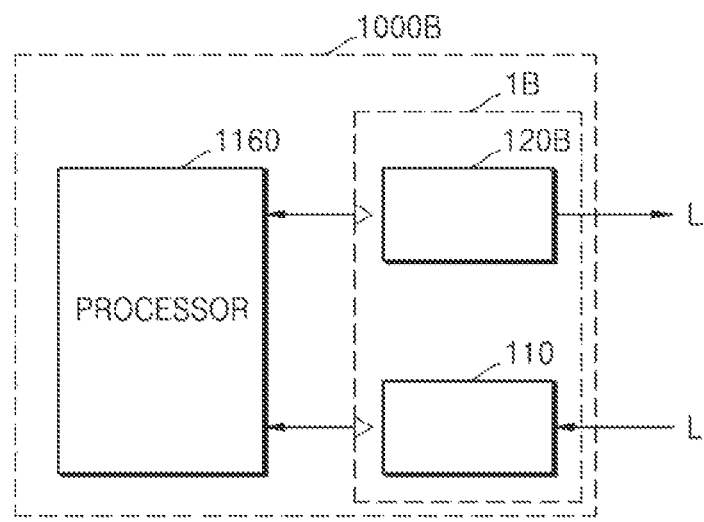
FIG. 27 is a diagram schematically illustrating a LiDAR element, according to an example embodiment.

As another example, the hybrid element 1 according to an example embodiment may be included in another element or another module other than the display element. For example, as illustrated in FIG. 27, a hybrid element 1B may be included in a light detection and ranging (LiDAR) element 1000B. For example, the LiDAR element 1000B may include the hybrid element 1B and a processor 1160 configured to control the hybrid element 1B. The second element 120B of the hybrid element 1B may be a laser that emits light L, and the first element 110 may be an optical sensor that receives reflected light L.

Figure 28:
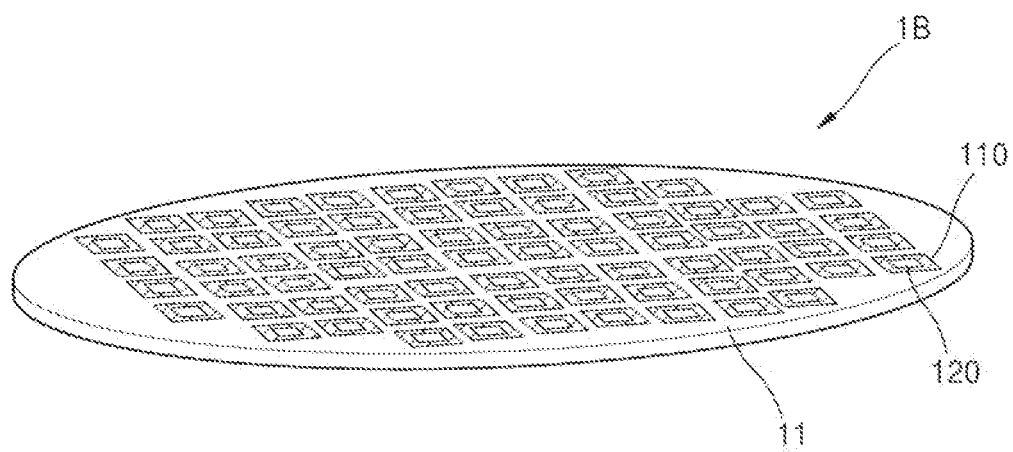
FIGS. 28 and 29 are diagrams illustrating a hybrid element according to still another example embodiment.
Figure 29:
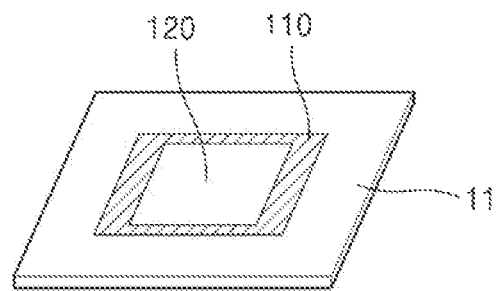

The above example embodiments are described based on examples in which the first element 110 and the second element 120 are arranged on the first substrate 11 to be spaced apart from each other in the hybrid element 1 or 1A. However, the arrangement of the first element 110 and the second element 120 of the hybrid element 1 according to embodiments are not limited thereto, and may vary. For example, referring to FIGS. 28 and 29, in the hybrid element 1B according to an example embodiment, the second element 120 may be arranged on the first element 110. The hybrid element 1B may be used in elements for implementing various functions, for example, a sensor module.

Figure 30:
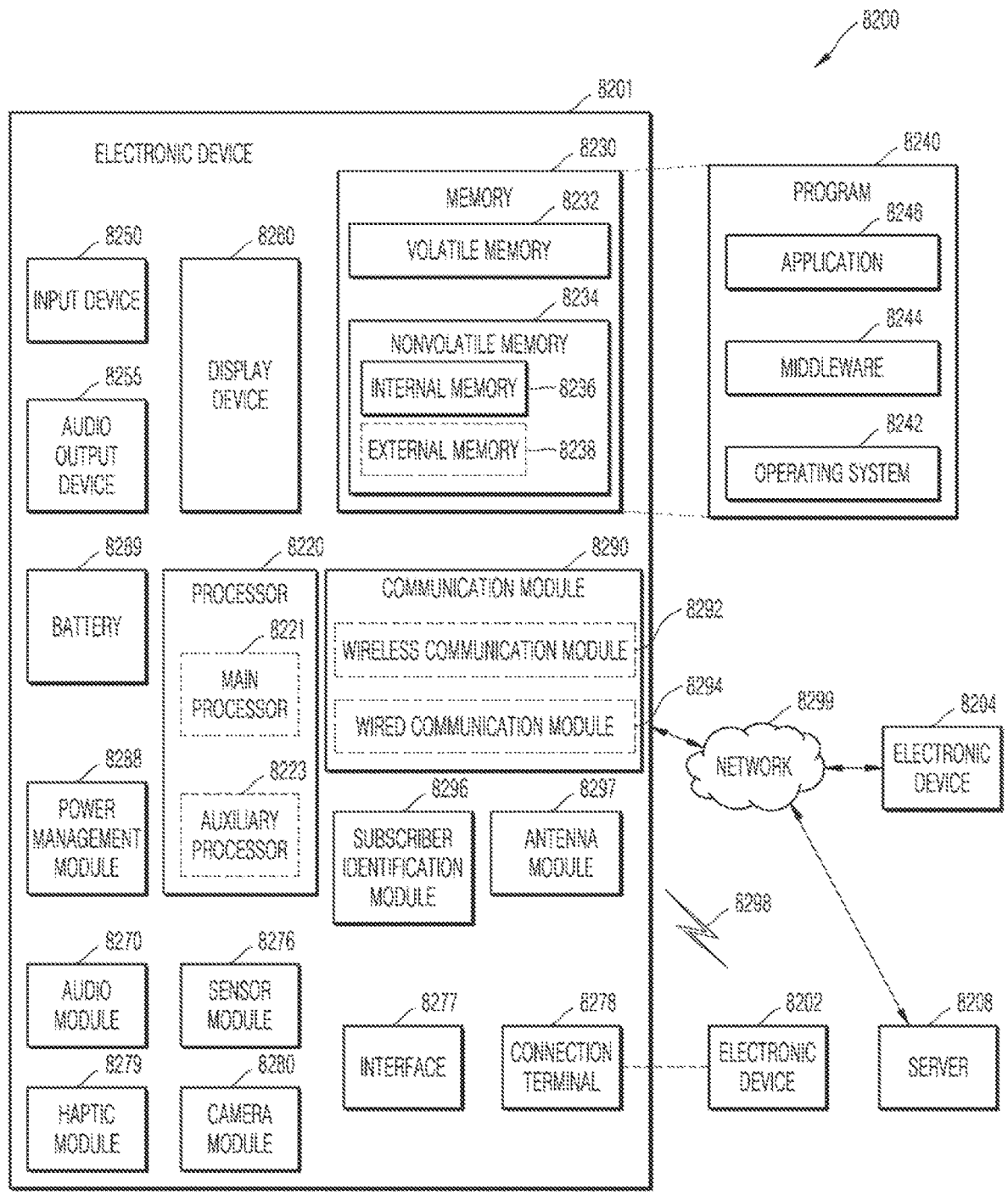
FIG. 30 is a block diagram of an electronic element according to an example embodiment.

FIG. 30 is a block diagram of an electronic element 8201 including a hybrid element according to an example embodiment.

Referring to FIG. 30, the electronic element 8201 may be provided in a network environment 8200. In the network environment 8200, the electronic element 8201 may communicate with another electronic element 8202 through a first network 8298 (e.g., a short-range wireless communication network, etc.), or may communicate with another electronic element 8204 and/or a server 8208 through a network 8299 (e.g., a long-range wireless communication network, etc.). The electronic element 8201 may communicate with the electronic element 8204 through the server 8208. The electronic element 8201 may include a processor 8220, a memory 8230, an input element 8250, an audio output element 8255, a display element 8260, an audio module 8270, a sensor module 8276, an interface 8277, a haptic module 8279, a camera module 8280, a power management module 8288, a battery 8289, a communication module 8290, a subscriber identification module 8296, and/or an antenna module 8297. In the electronic element 8201, some of these components may be omitted or other components may be added. Some of these components may be implemented in one integrated circuit. For example, the sensor module 8276 (e.g., a fingerprint sensor, an iris sensor, an illuminance sensor, etc.) may be implemented by being embedded in the display element 8260 (e.g., a display, etc.).

The processor 8220 may execute software (e.g., a program 8240, etc.) to control one or more other components (e.g., hardware or software components, etc.) of the electronic element 8201 connected to the processor 8220, and may perform a variety of data processing or operations. As part of the data processing or operations, the processor 8220 may load commands and/or data received from other components (e.g., the sensor module 8276, the communication module 8290, etc.) into a volatile memory 8232, process the commands and/or data stored in the volatile memory 8232, and store result data in a nonvolatile memory 8234. The processor 8220 may include a main processor 8221 (e.g., a central processing unit, an application processor, etc.) and an auxiliary processor 8223 (e.g., a graphics processing unit, an image signal processor, a sensor hub processor, a communication processor, etc.) that may operate independently of or together with the main processor 8221. The auxiliary processor 8223 may consume less power than the main processor 8221, and may perform a specialized function.

The auxiliary processor 8223 may control functions and/or states related to some components (e.g., the display element 8260, the sensor module 8276, the communication module 8290, etc.) of the electronic element 8201, on behalf of the main processor 8221 while the main processor 8221 is in an inactive (e.g., sleep) state, or with the main processor 8221 while the main processor 8221 is in an active (e.g., application execution) state. The auxiliary processor 8223 (e.g., an image signal processor, a communication processor, etc.) may be implemented as part of other functionally relevant components (e.g., the camera module 8280, the communication module 8290, etc.).

The memory 8230 may store a variety of data required by components (e.g., the processor 8220, the sensor module 8276, etc.) of the electronic element 8201. The data may include, for example, software (e.g., the program 8240, etc.) and input data and/or output data for commands related thereto. The memory 8230 may include the volatile memory 8232 and/or the nonvolatile memory 8234. The nonvolatile memory 8234 may include at least one of an internal memory 8236 or an external memory 8238.

The program 8240 may be stored as software in the memory 8230, and may include an operating system 8242, middleware 8244, and/or an application 8246.

The input element 8250 may receive commands and/or data to be used for the components (e.g., the processor 8220, etc.) of the electronic element 8201 from the outside (e.g., a user, etc.) of the electronic element 8201. The input element 8250 may include a remote controller, a microphone, a mouse, a keyboard, and/or a digital pen (e.g., a stylus pen, etc.).

The audio output element 8255 may output an audio signal to the outside of the electronic element 8201. The audio output element 8255 may include a speaker and/or a receiver. The speaker may be used for general purposes such as multimedia playback or recording playback, and the receiver may be used to receive an incoming call. The receiver may be combined as part of the speaker or may be implemented as an independent separate element.

The display element 8260 may visually provide information to the outside of the electronic element 8201. The display element 8260 may include a display, a hologram element, or a projector, and a control circuit for controlling the elements. The display element 8260 may include the hybrid element described with reference to FIGS. 1 to 29. The display element 8260 may include a touch circuitry configured to detect a touch, and/or a sensor circuitry (e.g., a pressure sensor, etc.) configured to measure the intensity of a force generated by the touch.

The audio module 8270 may convert a sound into an electrical signal, or vice versa. The audio module 8270 may obtain a sound through the input element 8250 or may output the sound through the audio output element 8255 and/or a speaker and/or headphones of another electronic element (e.g., the electronic element 8102, etc.) directly or wirelessly connected to the electronic element 8201.

The sensor module 8276 may detect an operating state (e.g., power, temperature, etc.) of the electronic element 8201 or an external environment state (e.g., a user state, etc.), and may generate an electrical signal and/or a data value corresponding to the detected state. The sensor module 8276 may include a gesture sensor, a gyro sensor, a barometric sensor, a magnetic sensor, an acceleration sensor, a grip sensor, a proximity sensor, a color sensor, an infrared (IR) sensor, a biometric sensor, a temperature sensor, a humidity sensor, and/or an illuminance sensor.

The interface 8277 may support one or more designated protocols, which may be used to directly or wirelessly connect the electronic element 8201 to another electronic element (e.g., the electronic element 8102, etc.). The interface 8277 may include a high-definition multimedia interface (HDMI), a universal serial bus (USB) interface, a secure digital (SD) card interface, and/or an audio interface.

A connection terminal 8278 may include a connector through which the electronic element 8201 may be physically connected to another electronic element (e.g., the electronic element 8102, etc.). The connection terminal 8278 may include an HDMI connector, a USB connector, an SD card connector, and/or an audio connector (e.g., a headphone connector, etc.).

The haptic module 8279 may convert an electrical signal into a mechanical stimulus (e.g., vibration, movement, etc.) or an electrical stimulus that a user may perceive through a tactile or motor sensations. The haptic module 8279 may include a motor, a piezoelectric element, and/or an electrical stimulation element.

The camera module 8280 may capture a still image or a moving image. The camera module 8280 may include a lens assembly including one or more lenses, image sensors, image signal processors, and/or flashes. The lens assembly included in the camera module 8280 may collect light emitted from an object to be image-captured.

The power management module 8288 may manage power supplied to the electronic element 8201. The power management module 8388 may be implemented as part of a PMIC.

The battery 8289 may supply power to components of the electronic element 8201. The battery 8289 may include a non-rechargeable primary cell, a rechargeable secondary cell, and/or a fuel cell.

The communication module 8290 may support establishment a direct (wired) communication channel and/or a wireless communication channel between the electronic element 8201 and other electronic elements (e.g., the electronic elements 8102 and 8104, the server 8108, etc.) and communication through the established communication channel. The communication module 8290 may operate independently of the processor 8220 (e.g., an application processor, etc.), and may include one or more communication processors supporting direct communication and/or wireless communication. The communication module 8290 may include a wireless communication module 8292 (e.g., a cellular communication module, a short-range wireless communication module, a global navigation satellite system (GNSS) communication module, etc.) and/or a wired communication module 8294 (e.g., a local area network (LAN) communication module, a power line communication module, etc.). The corresponding communication module among these communication modules may communicate with other electronic elements through the first network 8298 (e.g., a short-range communication network such as Bluetooth, WiFi Direct, or Infrared Data Association (IrDA)) or the second network 8299 (e.g., a long-range communication network such as a cellular network, the Internet, or a computer network (a LAN, a wide area network (WAN), etc.)). These various types of communication modules may be integrated into a single component (e.g., a single chip, etc.) or may be implemented as a plurality of separate components (e.g., a plurality of chips). The wireless communication module 8292 may identify and authenticate the electronic element 8201 within a communication network such as the first network 8298 and/or the second network 8299 by using subscriber information (e.g., an international mobile subscriber identifier (IMSI), etc.) stored in the subscriber identification module 8296.

The antenna module 8297 may transmit or receive a signal and/or power to or from the outside (e.g., other electronic elements, etc.). An antenna may include a radiator made of a conductive pattern formed on a substrate (e.g., a printed circuit board (PCB), etc.). The antenna module 8297 may include one or more antennas. When a plurality of antennas is included, the communication module 8290 may select an antenna suitable for a communication scheme used in a communication network such as the first network 8298 and/or the second network 8299, from among the plurality of antennas. A signal and/or power may be transmitted or received between the communication module 8290 and other electronic elements through the selected antenna. In addition to the antenna, other components (e.g., an RFIC, etc.) may be included as part of the antenna module 8297.

Some of the components may be connected to each other and exchange signals (e.g., commands, data, etc.) through a communication method between peripheral elements (e.g., a bus, a general-purpose input and output (GPIO), a serial peripheral interface (SPI), a mobile industry processor interface (MIPI), etc.).

Commands or data may be transmitted or received between the electronic element 8201 and the external electronic element 8204 through the server 8108 connected to the second network 8299. The other electronic elements 8202 and 8204 may be of a type that is the same as or different from the electronic element 8201. All or some of the operations executed by the electronic element 8201 may be executed by one or more of the other electronic elements 8202, 8204, and 8208. For example, when the electronic element 8201 is required to perform a certain function or service, the electronic element 8201 may request one or more other electronic elements to perform some or all of the function or service instead of executing the function or service by itself. The one or more other electronic elements that have received the request may execute an additional function or service related to the request, and may transmit a result of the execution to the electronic element 8201. To this end, cloud computing, distributed computing, and/or client-server computing technologies may be used.

Figure 31:
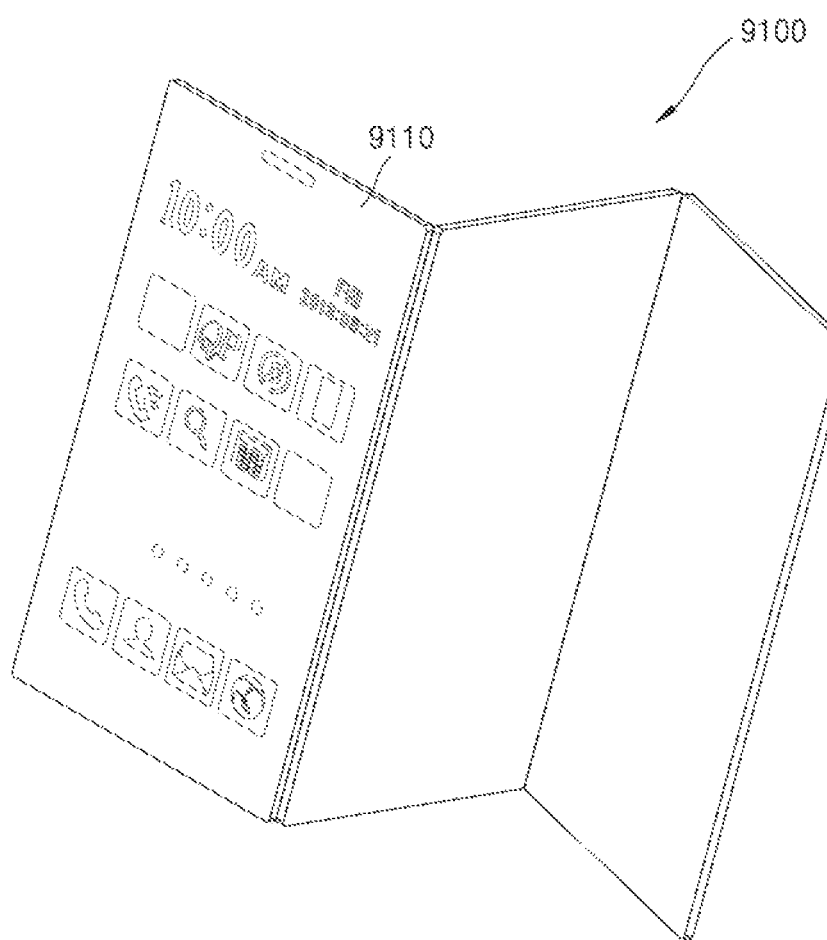
FIG. 31 is a diagram illustrating an example in which a display element is applied to a mobile element according to an example embodiment.

FIG. 31 is a diagram illustrating an example in which an electronic element is applied to a mobile element 9100 according to an example embodiment. The mobile element 9100 may include a display element 9110 according to an example embodiment. The display element 9110 may include the hybrid element described with reference to FIGS. 1 to 29. The display element 9110 may have a foldable structure, and may be applied to, for example, a multi-folder display. Although the mobile element 9100 is illustrated as a foldable display, the display element 9110 may be applicable to a general flat panel display.

Figure 32:
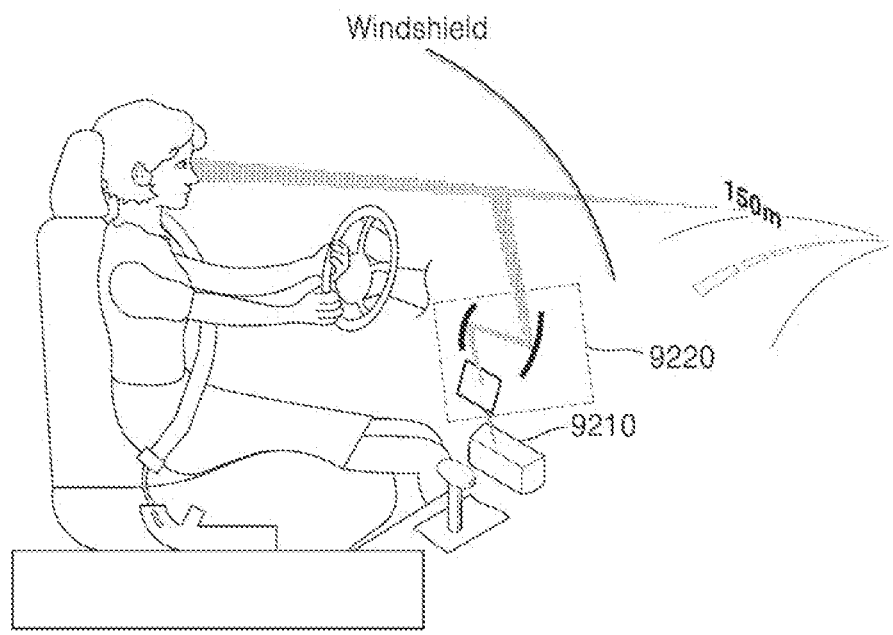
FIG. 32 is a diagram illustrating an example in which a display element is applied to a display element for an automobile according to an example embodiment.

FIG. 32 is a diagram illustrating an example in which a display element is applied to an automobile, according to an example embodiment. The display element may be applied to a head-up display element for an automobile. A head-up display element 9200 may include a display element 9210 in one area of the automobile, and at least one light path changing member 9220 configured to change the path of light to allow a driver to see an image generated by the display element 9210.

Figure 33:
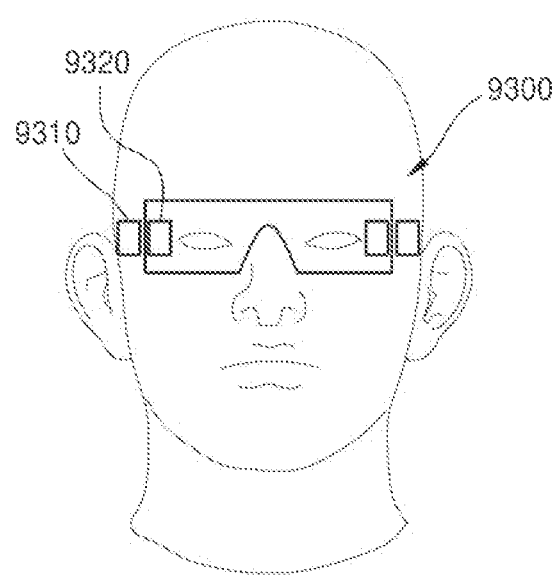
FIG. 33 is a diagram illustrating an example in which a display element is applied to augmented reality glasses according to an example embodiment.

FIG. 33 is a diagram illustrating an example in which a display element is applied to augmented reality glasses or virtual reality glasses 9300 according to an example embodiment. The augmented reality glasses 9300 may include a projection system 9310 configured to form an image, and at least one element 9320 configured to guide the image from the projection system 9310 to reach a user's eye. The projection system 9310 may include the hybrid element described with reference to FIGS. 1 to 29.

Figure 34:
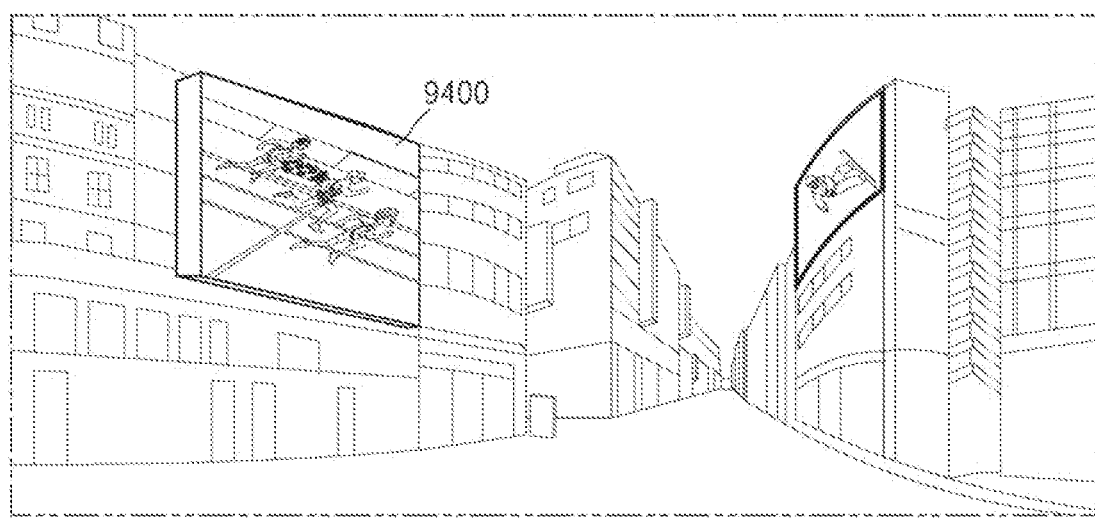
FIG. 34 is a diagram illustrating an example in which a display element is applied to a signage according to an example embodiment.

FIG. 34 is a diagram illustrating an example in which a display element is applied to a large-size signage 9400 according to an example embodiment. The signage 9400 may be used for outdoor advertising using a digital information display, and the content of an advertisement may be controlled through a communication network. The signage 9400 may be implemented, for example, by using the electronic element described with reference to FIG. 30.

Figure 35:
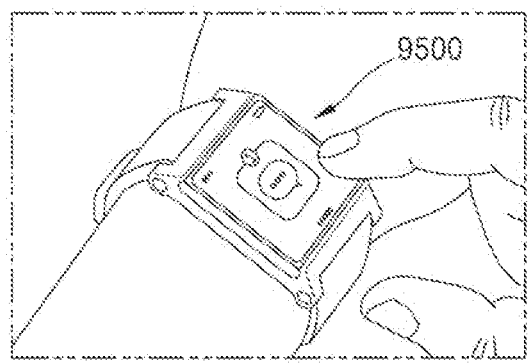
FIG. 35 is a diagram illustrating an example in which a display element is applied to a wearable display according to an example embodiment.

FIG. 35 is a diagram illustrating an example in which a display element is applied to a wearable display 9500 according to an example embodiment. The wearable display 9500 may include the hybrid element described with reference to FIGS. 1 to 29, and may be implemented by using the electronic element described with reference to FIG. 30.

The display element according to an example embodiment may be applied to various products such as a rollable TV, a stretchable display, and the like. In addition, the hybrid element according to an example embodiment may also be applied to a LiDAR element.

The hybrid element and a method of fabricating the same according to an example embodiment may efficiently arrange different types of elements on a large-area substrate by transferring some elements by the fluidic self-assembly method.

It should be understood that example embodiments described herein should be considered in a descriptive sense only and not for purposes of limitation. Descriptions of features or aspects within each example embodiment should typically be considered as available for other similar features or aspects in other embodiments. While example embodiments have been described with reference to the figures, it will be understood by those of ordinary skill in the art that various changes in form and details may be made therein without departing from the spirit and scope as defined by the following claims, and their equivalents.

What is claimed is:

1. A method of fabricating a hybrid element, the method comprising:
 forming a plurality of first elements on a first substrate;
 separating a plurality of second elements grown on a second substrate from the second substrate, a material of the second substrate being different from a material of the first substrate; and
 transferring the plurality of second elements, separated from the second substrate, onto the first substrate,
 wherein, in the transferring, the plurality of second elements are spaced apart from each other by a fluidic self-assembly method, and
 wherein each of the plurality of second elements comprises a shuttle layer grown on the second substrate, an element layer grown on the shuttle layer, and an electrode layer on the element layer.

2. The method of claim 1, wherein the second substrate is smaller than the first substrate.

3. The method of claim 1, wherein the first element is an element which is configured to be formed on the first substrate and comprises a group IV material.

4. The method of claim 3, wherein the first element comprises at least one of a complementary metal-oxide semiconductor (CMOS), a memory, an integrated circuit, an optical sensor, and a solar cell.

5. The method of claim 1, wherein the second substrate comprises a substrate comprising a group III-V material or a sapphire substrate, and
 wherein the second element comprises at least one of a light-emitting diode, a laser, a detector, and an electronic element.

6. The method of claim 5, wherein the electronic element comprises at least one of a high-electron-mobility transistor, a field-effect transistor, a thin-film transistor, or an insulated-gate bipolar transistor, a radio-frequency device, a thin-film battery, an integrated circuit, a transceiver, a memory, a voltage regulator, an amplifier, a switch, and an electro-optical sensor.

7. The method of claim 1, wherein, in the transferring, by the fluidic self-assembly method, the plurality of second elements are provided in each of a plurality of grooves of a transfer substrate to be spaced apart from each other at a preset interval, and
 wherein the plurality of second elements spaced apart from each other by the preset interval are transferred onto the first substrate.

8. The method of claim 1, wherein, in the transferring, the first substrate has a plurality of grooves spaced apart from each other by a preset distance, and
 wherein the plurality of second elements are transferred to each of the plurality of grooves by the fluidic self-assembly method.

9. The method of claim 1, wherein a thickness of the shuttle layer is greater than a thickness of the element layer.

10. The method of claim 1, wherein a planar shape of the element layer has a symmetrical structure,
 wherein the electrode layer comprises a plurality of electrodes provided on a same plane, and
 wherein the plurality of electrodes are symmetrical with respect to a center of the electrode layer.

11. The method of claim 1, wherein a planar shape of the element layer has an asymmetrical structure,
  wherein the electrode layer comprises a plurality of electrodes provided on a same plane, and the plurality of electrodes are provided in parallel.

12. The method of claim 1, wherein the element layer comprises a micro light-emitting device and a driving device configured to drive the micro light-emitting device, and
  wherein the driving device is monolithically coupled to the micro light-emitting device.

13. The method of claim 1, wherein the element layer comprises a group III-V material or a two-dimensional material.

14. The method of claim 1, wherein a size of the second element is smaller than a size of the first element.

* * * * *